(12) United States Patent
Hydrick et al.

(10) Patent No.: US 9,934,967 B2
(45) Date of Patent: Apr. 3, 2018

(54) FORMATION OF DEVICES BY EPITAXIAL LAYER OVERGROWTH

(71) Applicant: Taiwan Semiconductor Manufacturing Company, Ltd., Hsin-Chu (TW)

(72) Inventors: Jennifer M. Hydrick, Kingston, NH (US); Jizhong Li, Bordentown, NJ (US); Zhinyuan Cheng, Lincoln, MA (US); James Fiorenza, Wilmington, MA (US); Jie Bai, Bedford, NH (US); Ji-Soo Park, Methuen, MA (US); Anthony J. Lochtefeld, Ipswich, MA (US)

(73) Assignee: Taiwan Semiconductor Manufacturing CO., LTD., Hsin-Chu (TW)

( * ) Notice: Subject to any disclaimer, the term of this patent is extended or adjusted under 35 U.S.C. 154(b) by 0 days.

(21) Appl. No.: 13/737,731

(22) Filed: Jan. 9, 2013

(65) Prior Publication Data
US 2013/0134480 A1 May 30, 2013

Related U.S. Application Data

(60) Division of application No. 13/243,521, filed on Sep. 23, 2011, now Pat. No. 8,384,196, which is a
(Continued)

(51) Int. Cl.
*H01L 31/18* (2006.01)
*H01L 31/0687* (2012.01)
(Continued)

(52) U.S. Cl.
CPC .... *H01L 21/02538* (2013.01); *H01L 21/0245* (2013.01); *H01L 21/02381* (2013.01);
(Continued)

(58) Field of Classification Search
None
See application file for complete search history.

(56) References Cited

U.S. PATENT DOCUMENTS 660,928 A * 10/1900 Rowcroft .................. 139/73
4,307,510 A 12/1981 Sawyer et al.
(Continued)

FOREIGN PATENT DOCUMENTS

CN 2550906 5/2003
DE 10017137 10/2000
(Continued)

OTHER PUBLICATIONS

Zytkiewicz et al., Laterally Overgrown Structures as Substrates for lattice Mismatched Epitaxy, Thin Solid Films, vol. 412, p. 64-75 (2002).*
(Continued)

*Primary Examiner* — Asok K Sarkar
(74) *Attorney, Agent, or Firm* — Slater Matsil, LLP

(57) ABSTRACT

Methods and structures are provided for formation of devices, e.g., solar cells, on substrates including, e.g., lattice-mismatched materials, by the use of aspect ratio trapping and epitaxial layer overgrowth. A method includes forming an opening in a masking layer disposed over a substrate that includes a first semiconductor material. A first layer, which includes a second semiconductor material lattice-mismatched to the first semiconductor material, is formed within the opening. The first layer has a thickness sufficient to extend above a top surface of the masking layer. A second layer, which includes the second semiconductor material, is formed on the first layer and over at least a portion of the masking layer. A vertical growth rate of the first layer is greater than a lateral growth rate of the first layer
(Continued)

1) Inverted Growth on Ge ART + ELO

2) Flip, Bond, Selectively Remove Substrate and a lateral growth rate of the second layer is greater than a vertical growth rate of the second layer.

20 Claims, 5 Drawing Sheets

Related U.S. Application Data continuation of application No. 12/680,872, filed as application No. PCT/US2009/057493 on Sep. 18, 2009, now Pat. No. 8,034,697.

(60) Provisional application No. 61/098,597, filed on Sep. 19, 2008, provisional application No. 61/099,074, filed on Sep. 22, 2008, provisional application No. 61/104,466, filed on Oct. 10, 2008.

(51) Int. Cl.
*H01L 29/205* (2006.01)
*H01L 21/02* (2006.01)

(52) U.S. Cl.
CPC .. *H01L 21/02461* (2013.01); *H01L 21/02463* (2013.01); *H01L 21/02543* (2013.01); *H01L 21/02546* (2013.01); *H01L 21/02636* (2013.01); *H01L 21/02639* (2013.01); *H01L 21/02647* (2013.01); *H01L 29/205* (2013.01); *H01L 31/0687* (2013.01); *H01L 31/06875* (2013.01); *H01L 31/1808* (2013.01); *H01L 31/1852* (2013.01); *H01L 31/1892* (2013.01); *Y02E 10/544* (2013.01)

(56) References Cited

U.S. PATENT DOCUMENTS

| | | | |
|---|---|---|---|
| 4,322,253 A | 3/1982 | Pankove et al. | |
| 4,370,510 A | 1/1983 | Stirn | |
| 4,545,109 A | 10/1985 | Reichert | |
| 4,551,394 A | 11/1985 | Betsch et al. | |
| 4,651,179 A | 3/1987 | Reichert | |
| 4,727,047 A | 2/1988 | Bozler et al. | |
| 4,774,205 A | 9/1988 | Choi et al. | |
| 4,789,643 A | 12/1988 | Kajikawa | |
| 4,826,784 A | 5/1989 | Salerno et al. | |
| 4,860,081 A | 8/1989 | Cogan | |
| 4,876,210 A | 10/1989 | Barnett et al. | |
| 4,948,456 A | 8/1990 | Schubert | |
| 4,963,508 A | 10/1990 | Umeno et al. | |
| 5,032,893 A | 7/1991 | Fitzgerald, Jr. et al. | |
| 5,034,337 A | 7/1991 | Mosher et al. | |
| 5,061,644 A | 10/1991 | Yue et al. | |
| 5,079,616 A | 1/1992 | Yacobi et al. | |
| 5,091,333 A | 2/1992 | Fan et al. | |
| 5,091,767 A | 2/1992 | Bean et al. | |
| 5,093,699 A | 3/1992 | Weichold et al. | |
| 5,098,850 A | 3/1992 | Nishida et al. | |
| 5,105,247 A | 4/1992 | Cavanaugh | |
| 5,108,947 A | 4/1992 | Demeester et al. | |
| 5,156,995 A | 10/1992 | Fitzgerald, Jr. et al. | |
| 5,158,907 A * | 10/1992 | Fitzgerald, Jr. | 438/504 |
| 5,159,413 A | 10/1992 | Calviello et al. | |
| 5,164,359 A | 11/1992 | Calviello et al. | |
| 5,166,767 A | 11/1992 | Kapoor et al. | |
| 5,223,043 A | 6/1993 | Olson et al. | |
| 5,236,546 A | 8/1993 | Mizutani | |
| 5,238,869 A | 8/1993 | Shichijo et al. | |
| 5,256,594 A | 10/1993 | Wu et al. | |
| 5,269,852 A | 12/1993 | Nishida | |
| 5,269,876 A | 12/1993 | Mizutani | |
| 5,272,105 A | 12/1993 | Yacobi et al. | |
| 5,281,283 A | 1/1994 | Tokunaga et al. | |
| 5,285,086 A | 2/1994 | Fitzgerald, Jr. | |
| 5,295,150 A | 3/1994 | Vangieson et al. | |
| 5,356,831 A | 10/1994 | Calviello et al. | |
| 5,403,751 A | 4/1995 | Nishida et al. | |
| 5,405,453 A | 4/1995 | Ho et al. | |
| 5,407,491 A | 4/1995 | Freundlich et al. | |
| 5,410,167 A | 4/1995 | Saito | |
| 5,417,180 A | 5/1995 | Nakamura | |
| 5,427,976 A | 6/1995 | Koh et al. | |
| 5,432,120 A | 7/1995 | Meister et al. | |
| 5,438,018 A | 8/1995 | Mori et al. | |
| 5,461,243 A | 10/1995 | Ek et al. | |
| 5,518,953 A | 5/1996 | Takasu | |
| 5,528,209 A | 6/1996 | MacDonald et al. | |
| 5,545,586 A | 8/1996 | Koh | |
| 5,548,129 A | 8/1996 | Kubena | |
| 5,589,696 A | 12/1996 | Baba | |
| 5,621,227 A | 4/1997 | Joshi | |
| 5,622,891 A | 4/1997 | Saito | |
| 5,640,022 A | 6/1997 | Inai | |
| 5,710,436 A | 1/1998 | Tanamoto et al. | |
| 5,717,709 A | 2/1998 | Sasaki et al. | |
| 5,792,679 A | 8/1998 | Nakato | |
| 5,825,049 A | 10/1998 | Simmons et al. | |
| 5,825,240 A | 10/1998 | Geis et al. | |
| 5,849,077 A | 12/1998 | Kenney | |
| 5,853,497 A | 12/1998 | Lillington et al. | |
| 5,869,845 A | 2/1999 | Vander Wagt et al. | |
| 5,883,549 A | 3/1999 | De Los Santos | |
| 5,886,385 A | 3/1999 | Arisumi et al. | |
| 5,903,170 A | 5/1999 | Kulkarni et al. | |
| 5,953,361 A | 9/1999 | Borchert et al. | |
| 5,959,308 A | 9/1999 | Shichijo et al. | |
| 5,966,620 A | 10/1999 | Sakaguchi et al. | |
| 5,998,781 A | 12/1999 | Vawter et al. | |
| 6,011,271 A | 1/2000 | Sakuma et al. | |
| 6,015,979 A | 1/2000 | Sugiura et al. | |
| 6,049,098 A | 4/2000 | Sato | |
| 6,083,598 A | 7/2000 | Ohkubo et al. | |
| 6,100,106 A | 8/2000 | Yamaguchi et al. | |
| 6,110,813 A | 8/2000 | Ota et al. | |
| 6,111,288 A | 8/2000 | Watanabe et al. | |
| 6,121,542 A | 9/2000 | Shiotsuka et al. | |
| 6,150,242 A | 11/2000 | Van de Wagt et al. | |
| 6,153,010 A * | 11/2000 | Kiyoku | B82Y 20/00 117/106 |
| 6,191,432 B1 | 2/2001 | Sugiyama et al. | |
| 6,225,650 B1 | 5/2001 | Tadatomo et al. | |
| 6,228,691 B1 | 5/2001 | Doyle | |
| 6,229,153 B1 | 5/2001 | Botez et al. | |
| 6,235,547 B1 | 5/2001 | Sakuma et al. | |
| 6,252,261 B1 | 6/2001 | Usui et al. | |
| 6,252,287 B1 | 6/2001 | Kurtz et al. | |
| 6,255,198 B1 * | 7/2001 | Linthicum et al. | 438/481 |
| 6,271,551 B1 | 8/2001 | Schmitz et al. | |
| 6,274,889 B1 | 8/2001 | Ota et al. | |
| 6,300,650 B1 | 10/2001 | Sato | |
| 6,320,220 B1 | 11/2001 | Watanabe et al. | |
| 6,325,850 B1 | 12/2001 | Beaumont et al. | |
| 6,339,232 B1 | 1/2002 | Takagi | |
| 6,342,404 B1 | 1/2002 | Shibata et al. | |
| 6,348,096 B1 | 2/2002 | Sunakawa et al. | |
| 6,352,942 B1 | 3/2002 | Luan et al. | |
| 6,362,071 B1 | 3/2002 | Nguyen et al. | |
| 6,380,051 B1 | 4/2002 | Yuasa et al. | |
| 6,380,590 B1 | 4/2002 | Yu | |
| 6,403,451 B1 | 6/2002 | Linthicum et al. | |
| 6,407,425 B1 | 6/2002 | Babcock et al. | |
| 6,456,214 B1 | 9/2002 | van de Wagt | |
| 6,458,614 B1 | 10/2002 | Nanishi et al. | |
| 6,475,869 B1 | 11/2002 | Yu | |
| 6,492,216 B1 | 12/2002 | Yeo et al. | |
| 6,500,257 B1 | 12/2002 | Wang et al. | |
| 6,503,610 B2 | 1/2003 | Hiramatsu et al. | |
| 6,512,252 B1 | 1/2003 | Takagi et al. | |
| 6,521,514 B1 | 2/2003 | Gehrke et al. | |
| 6,552,259 B1 | 4/2003 | Hosomi et al. | |
| 6,566,284 B2 | 5/2003 | Thomas, III et al. | |
| 6,576,532 B1 | 6/2003 | Jones et al. | |
| 6,579,463 B1 | 6/2003 | Winningham et al. | |

(56) References Cited

U.S. PATENT DOCUMENTS

| | | |
|---|---|---|
| 6,594,293 B1 * | 7/2003 | Bulsara et al. ............ 372/43.01 |
| 6,603,172 B1 | 8/2003 | Segawa et al. |
| 6,606,335 B1 | 8/2003 | Kuramata et al. |
| 6,617,643 B1 | 9/2003 | Goodwin-Johansson |
| 6,635,110 B1 | 10/2003 | Luan et al. |
| 6,645,295 B1 | 11/2003 | Koike et al. |
| 6,645,797 B1 | 11/2003 | Buynoski et al. |
| 6,686,245 B1 | 2/2004 | Mathew et al. |
| 6,703,253 B2 | 3/2004 | Koide |
| 6,709,982 B1 | 3/2004 | Buynoski et al. |
| 6,710,368 B2 | 3/2004 | Fisher et al. |
| 6,720,196 B2 | 4/2004 | Kunisato et al. |
| 6,727,523 B2 | 4/2004 | Morita |
| 6,753,555 B2 | 6/2004 | Takagi et al. |
| 6,756,611 B2 | 6/2004 | Kiyoku et al. |
| 6,762,483 B1 | 7/2004 | Krivokapic et al. |
| 6,767,793 B2 | 7/2004 | Clark et al. |
| 6,784,074 B2 | 8/2004 | Shchukin et al. |
| 6,787,864 B2 | 9/2004 | Paton et al. |
| 6,794,718 B2 | 9/2004 | Nowak et al. |
| 6,800,910 B2 | 10/2004 | Lin et al. |
| 6,803,598 B1 | 10/2004 | Berger et al. |
| 6,809,351 B2 | 10/2004 | Kuramoto et al. |
| 6,812,053 B1 | 11/2004 | Kong et al. |
| 6,812,495 B2 | 11/2004 | Wada et al. |
| 6,815,241 B2 | 11/2004 | Wang |
| 6,815,738 B2 | 11/2004 | Rim |
| 6,825,534 B2 | 11/2004 | Chen et al. |
| 6,831,350 B1 | 12/2004 | Liu et al. |
| 6,835,246 B2 | 12/2004 | Zaidi |
| 6,835,618 B1 | 12/2004 | Dakshina-Murthy et al. |
| 6,838,322 B2 | 1/2005 | Pham et al. |
| 6,841,410 B2 | 1/2005 | Sasaoka |
| 6,841,808 B2 | 1/2005 | Shibata et al. |
| 6,849,077 B2 | 2/2005 | Ricci |
| 6,849,487 B2 | 2/2005 | Taylor, Jr. et al. |
| 6,849,884 B2 | 2/2005 | Clark et al. |
| 6,855,583 B1 | 2/2005 | Krivokapic et al. |
| 6,855,982 B1 | 2/2005 | Xiang et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,882,051 B2 | 4/2005 | Majumdar et al. |
| 6,887,773 B2 | 5/2005 | Gunn, III et al. |
| 6,888,181 B1 | 5/2005 | Liao et al. |
| 6,900,070 B2 | 5/2005 | Craven et al. |
| 6,900,502 B2 | 5/2005 | Ge et al. |
| 6,902,965 B2 | 6/2005 | Ge et al. |
| 6,902,991 B2 | 6/2005 | Xiang et al. |
| 6,909,186 B2 | 6/2005 | Chu |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,921,963 B2 | 7/2005 | Krivokapic et al. |
| 6,921,982 B2 | 7/2005 | Joshi et al. |
| 6,936,875 B2 | 8/2005 | Sugii et al. |
| 6,943,407 B2 | 9/2005 | Ouyang et al. |
| 6,946,683 B2 | 9/2005 | Sano et al. |
| 6,949,769 B2 | 9/2005 | Hu et al. |
| 6,951,819 B2 | 10/2005 | Iles et al. |
| 6,955,969 B2 | 10/2005 | Djomehri et al. |
| 6,955,977 B2 | 10/2005 | Kong et al. |
| 6,958,254 B2 | 10/2005 | Seifert |
| 6,960,781 B2 | 11/2005 | Currie et al. |
| 6,974,733 B2 | 12/2005 | Boyanov et al. |
| 6,977,194 B2 | 12/2005 | Belyansky et al. |
| 6,982,204 B2 | 1/2006 | Saxler et al. |
| 6,982,435 B2 | 1/2006 | Shibata et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,996,147 B2 | 2/2006 | Majumdar et al. |
| 6,998,684 B2 | 2/2006 | Anderson et al. |
| 7,001,804 B2 | 2/2006 | Dietz et al. |
| 7,002,175 B1 | 2/2006 | Singh et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green |
| 7,041,178 B2 | 5/2006 | Tong et al. |
| 7,045,401 B2 | 5/2006 | Lee et al. |
| 7,049,627 B2 | 5/2006 | Vineis et al. |
| 7,061,065 B2 | 6/2006 | Horng et al. |
| 7,074,623 B2 | 7/2006 | Lochtefeld et al. |
| 7,078,299 B2 | 7/2006 | Maszara et al. |
| 7,078,731 B2 | 7/2006 | D'Evelyn et al. |
| 7,084,051 B2 | 8/2006 | Ueda |
| 7,084,441 B2 | 8/2006 | Saxler |
| 7,087,965 B2 | 8/2006 | Chan et al. |
| 7,088,143 B2 | 8/2006 | Ding et al. |
| 7,091,561 B2 | 8/2006 | Matsushita et al. |
| 7,095,043 B2 | 8/2006 | Oda et al. |
| 7,098,508 B2 | 8/2006 | Ieong et al. |
| 7,101,444 B2 | 9/2006 | Shchukin et al. |
| 7,109,516 B2 | 9/2006 | Langdo et al. |
| 7,118,987 B2 | 10/2006 | Fu et al. |
| 7,119,402 B2 | 10/2006 | Kinoshita et al. |
| 7,122,733 B2 | 10/2006 | Narayanan et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,138,302 B2 | 11/2006 | Xiang et al. |
| 7,145,167 B1 | 12/2006 | Chu |
| 7,154,118 B2 | 12/2006 | Lindert et al. |
| 7,160,753 B2 | 1/2007 | Williams, Jr. |
| 7,164,183 B2 | 1/2007 | Sakaguchi et al. |
| 7,176,522 B2 | 2/2007 | Cheng et al. |
| 7,179,727 B2 | 2/2007 | Capewell et al. |
| 7,180,134 B2 | 2/2007 | Yang et al. |
| 7,195,993 B2 | 3/2007 | Zheleva et al. |
| 7,198,995 B2 | 4/2007 | Chidambarrao et al. |
| 7,205,586 B2 | 4/2007 | Takagi et al. |
| 7,205,604 B2 | 4/2007 | Ouyang et al. |
| 7,211,864 B2 | 5/2007 | Seliskar |
| 7,217,882 B2 | 5/2007 | Walukiewicz et al. |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 7,297,569 B2 | 11/2007 | Bude et al. |
| 7,344,942 B2 | 3/2008 | Korber |
| 7,361,576 B2 | 4/2008 | Imer et al. |
| 7,372,066 B2 | 5/2008 | Sato et al. |
| 7,420,201 B2 | 9/2008 | Langdo et al. |
| 7,449,379 B2 | 11/2008 | Ochimizu et al. |
| 7,582,498 B2 | 9/2009 | D'Evelyn et al. |
| 7,626,246 B2 | 12/2009 | Lochtefeld et al. |
| 7,638,842 B2 * | 12/2009 | Currie et al. ................. 257/347 |
| 7,655,960 B2 | 2/2010 | Nakahata et al. |
| 7,727,795 B2 * | 6/2010 | Stan et al. ..................... 438/82 |
| 7,777,250 B2 * | 8/2010 | Lochtefeld ..................... 257/190 |
| 7,799,592 B2 | 9/2010 | Lochtefeld |
| 7,825,328 B2 | 11/2010 | Li |
| 7,829,442 B2 * | 11/2010 | Westhoff et al. ............. 438/478 |
| 7,875,958 B2 | 1/2011 | Cheng et al. |
| 8,034,697 B2 * | 10/2011 | Fiorenza et al. ............. 438/481 |
| 8,129,747 B2 * | 3/2012 | Westhoff et al. ............. 257/190 |
| 8,173,551 B2 | 5/2012 | Bai et al. ..................... 438/758 |
| 8,183,667 B2 | 5/2012 | Park ............................ 257/615 |
| 8,274,097 B2 * | 9/2012 | Cheng ........................... 257/190 |
| 8,324,660 B2 * | 12/2012 | Lochtefeld et al. .......... 257/190 |
| 8,344,242 B2 * | 1/2013 | Fiorenza et al. ............. 136/255 |
| 8,384,196 B2 * | 2/2013 | Cheng et al. ................. 257/618 |
| 8,415,718 B2 * | 9/2013 | Xu et al. ...................... 257/255 |
| 2001/0006249 A1 | 7/2001 | Fitzgerald |

(56) References Cited

U.S. PATENT DOCUMENTS

| | | |
|---|---|---|
| 2001/0045604 A1 | 11/2001 | Oda et al. |
| 2002/0011612 A1 | 1/2002 | Hieda |
| 2002/0017642 A1 | 2/2002 | Mizushima et al. |
| 2002/0022290 A1 | 2/2002 | Kong et al. |
| 2002/0030246 A1 | 3/2002 | Eisenbeiser et al. |
| 2002/0036290 A1 | 3/2002 | Inaba et al. |
| 2002/0046693 A1 | 4/2002 | Kiyoku et al. |
| 2002/0047155 A1 | 4/2002 | Babcock et al. |
| 2002/0066403 A1 | 6/2002 | Sunakawa et al. |
| 2002/0070383 A1 | 6/2002 | Shibata et al. |
| 2002/0084000 A1 | 7/2002 | Fitzgerald |
| 2002/0127427 A1 | 9/2002 | Young et al. |
| 2002/0168802 A1 | 11/2002 | Hsu et al. |
| 2002/0168844 A1 | 11/2002 | Kuramoto et al. |
| 2002/0179005 A1 | 12/2002 | Koike et al. |
| 2003/0030117 A1 | 2/2003 | Iwasaki et al. |
| 2003/0045017 A1 | 3/2003 | Hiramatsu et al. |
| 2003/0057486 A1 | 3/2003 | Gambino et al. |
| 2003/0064535 A1 | 4/2003 | Kub et al. |
| 2003/0070707 A1 | 4/2003 | King et al. |
| 2003/0087462 A1 | 5/2003 | Koide et al. |
| 2003/0089899 A1 | 5/2003 | Lieber et al. |
| 2003/0155586 A1 | 8/2003 | Koide et al. |
| 2003/0168002 A1 | 9/2003 | Zaidi |
| 2003/0178677 A1 | 9/2003 | Clark et al. |
| 2003/0178681 A1 | 9/2003 | Clark et al. |
| 2003/0183827 A1 | 10/2003 | Kawaguchi et al. |
| 2003/0203531 A1 | 10/2003 | Shchukin et al. |
| 2003/0207518 A1 | 11/2003 | Kong et al. |
| 2003/0227036 A1 | 12/2003 | Sugiyama et al. |
| 2003/0230759 A1 | 12/2003 | Thomas, III et al. |
| 2004/0005740 A1 | 1/2004 | Lochtefeld et al. |
| 2004/0012037 A1 | 1/2004 | Venkatesan et al. |
| 2004/0016921 A1 | 1/2004 | Botez et al. |
| 2004/0031979 A1 | 2/2004 | Lochtefeld et al. |
| 2004/0041932 A1 | 3/2004 | Chao et al. |
| 2004/0043584 A1 | 3/2004 | Thomas et al. |
| 2004/0072410 A1 | 4/2004 | Motoki et al. |
| 2004/0075105 A1 | 4/2004 | Leitz et al. |
| 2004/0075464 A1 | 4/2004 | Samuelson et al. |
| 2004/0082150 A1 | 4/2004 | Kong et al. |
| 2004/0087051 A1 | 5/2004 | Furuya et al. |
| 2004/0092060 A1 | 5/2004 | Gambino et al. |
| 2004/0118451 A1 | 6/2004 | Walukiewicz et al. |
| 2004/0121507 A1 | 6/2004 | Bude et al. |
| 2004/0123796 A1 | 7/2004 | Nagai et al. |
| 2004/0142503 A1 | 7/2004 | Lee et al. |
| 2004/0150001 A1 | 8/2004 | Shchukin et al. |
| 2004/0155249 A1 | 8/2004 | Narui et al. |
| 2004/0173812 A1 | 9/2004 | Currie et al. |
| 2004/0183078 A1 | 9/2004 | Wang |
| 2004/0185665 A1 | 9/2004 | Kishimoto et al. |
| 2004/0188791 A1 | 9/2004 | Horng et al. |
| 2004/0195624 A1 | 10/2004 | Liu et al. |
| 2004/0227187 A1 | 11/2004 | Cheng et al. |
| 2004/0247218 A1 | 12/2004 | Ironside et al. |
| 2004/0256613 A1 | 12/2004 | Oda et al. |
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0003572 A1 | 1/2005 | Hahn et al. |
| 2005/0009304 A1 | 1/2005 | Zheleva et al. |
| 2005/0017351 A1 | 1/2005 | Ravi |
| 2005/0035410 A1 | 2/2005 | Yeo et al. |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han et al. |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0093154 A1 | 5/2005 | Kottantharayil et al. |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0121688 A1 | 6/2005 | Nagai et al. |
| 2005/0127451 A1 | 6/2005 | Tsuchiya et al. |
| 2005/0136626 A1 | 6/2005 | Morse |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0148161 A1 | 7/2005 | Chen et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0211291 A1 | 9/2005 | Bianchi |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1 | 12/2005 | Fetzer et al. |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0021565 A1* | 2/2006 | Zahler et al. ............... 117/89 |
| 2006/0049409 A1 | 3/2006 | Rafferty et al. |
| 2006/0057825 A1 | 3/2006 | Bude et al. |
| 2006/0073681 A1 | 4/2006 | Han |
| 2006/0105533 A1 | 5/2006 | Chong et al. |
| 2006/0112986 A1 | 6/2006 | Atwater, Jr. et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1* | 7/2006 | Wanlass ................... 136/249 |
| 2006/0145264 A1 | 7/2006 | Chidambarrao et al. |
| 2006/0160291 A1 | 7/2006 | Lee et al. |
| 2006/0162768 A1 | 7/2006 | Wanlass et al. |
| 2006/0166437 A1 | 7/2006 | Korber |
| 2006/0169987 A1 | 8/2006 | Miura et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0266281 A1 | 11/2006 | Beaumont et al. |
| 2006/0267047 A1 | 11/2006 | Murayama |
| 2006/0292719 A1 | 12/2006 | Lochtefeld et al. |
| 2007/0025670 A1 | 2/2007 | Pan et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0099315 A1 | 5/2007 | Maa et al. |
| 2007/0099329 A1 | 5/2007 | Maa et al. |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0099785 A1 | 5/2008 | Bai et al. |
| 2008/0154197 A1 | 6/2008 | Derrico et al. |
| 2008/0187018 A1 | 8/2008 | Li |
| 2008/0194078 A1 | 8/2008 | Akiyama et al. |

(56) References Cited

U.S. PATENT DOCUMENTS

| | | | |
|---|---|---|---|
| 2008/0217622 A1* | 9/2008 | Goyal | 257/64 |
| 2008/0245400 A1 | 10/2008 | Li | |
| 2008/0257409 A1 | 10/2008 | Li et al. | |
| 2008/0286957 A1 | 11/2008 | Lee et al. | |
| 2009/0039361 A1 | 2/2009 | Li et al. | |
| 2009/0042344 A1 | 2/2009 | Ye et al. | |
| 2009/0065047 A1 | 3/2009 | Fiorenza et al. | |
| 2009/0072284 A1 | 3/2009 | King et al. | |
| 2009/0110898 A1 | 4/2009 | Levy et al. | |
| 2009/0321882 A1 | 12/2009 | Park | |
| 2010/0012976 A1 | 1/2010 | Hydrick et al. | |
| 2010/0025683 A1 | 2/2010 | Cheng | |
| 2010/0072515 A1 | 3/2010 | Park et al. | |
| 2010/0078680 A1 | 4/2010 | Cheng et al. | |
| 2010/0176371 A1 | 7/2010 | Lochtefeld | |
| 2010/0176375 A1 | 7/2010 | Lochtefeld | |
| 2010/0213511 A1 | 8/2010 | Lochtefeld | |
| 2010/0216277 A1 | 8/2010 | Fiorenza et al. | |
| 2010/0252861 A1 | 10/2010 | Lochtefeld | |
| 2010/0308376 A1 | 12/2010 | Takada et al. | |
| 2011/0011438 A1 | 1/2011 | Li | |
| 2011/0049568 A1 | 3/2011 | Lochtefeld et al. | |
| 2011/0086498 A1 | 4/2011 | Cheng et al. | |

FOREIGN PATENT DOCUMENTS

| | | |
|---|---|---|
| DE | 10320160 | 8/2004 |
| EP | 0352472 | 6/1989 |
| EP | 0600276 | 6/1994 |
| EP | 0817096 | 1/1998 |
| EP | 1551063 | 7/2005 |
| EP | 1796180 | 6/2007 |
| GB | 2215514 | 9/1989 |
| JP | 2062090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004200375 | 7/2004 |
| JP | 2009177167 | 8/2009 |
| KR | 20030065631 | 8/2003 |
| KR | 20090010284 | 1/2009 |
| TW | 544930 | 8/2003 |
| WO | WO200072383 | 11/2000 |
| WO | WO2001001465 | 1/2001 |
| WO | WO200209187 | 1/2002 |
| WO | WO2002086952 | 10/2002 |
| WO | WO2002088834 | 11/2002 |
| WO | WO2003073517 | 9/2003 |
| WO | WO2004004927 | 1/2004 |
| WO | WO2004023536 | 3/2004 |
| WO | WO2005013375 | 2/2005 |
| WO | WO2005048330 | 5/2005 |
| WO | WO2005098963 | 10/2005 |
| WO | WO2005122267 | 12/2005 |
| WO | WO2006205407 | 3/2006 |
| WO | WO2006125040 | 11/2006 |
| WO | WO 2008/030574 A1 | 3/2008 |
| WO | WO2008124154 | 10/2008 |

OTHER PUBLICATIONS

Kwok K. Ng, "Resonant-Tunneling Diode," Complete Guide to Semiconductor Devices, Chapter 10. Nov. 3, 2010, pp. 75-83.
"Communication pursuant to Article 94(3) EPC," Application No. 06 770 525.1-2203, Applicant: Taiwan Semiconductor Company, Ltd., Feb. 17, 2011, 4 pages.
68 Applied Physics Letters 7, 1999, pp. 774-779 (trans. of relevant portions attached).
Ames, "Intel Says More Efficient Chips are Coming," PC World, available at: http://www.pcworld.com/printable/article/id,126044/printable.html (Jun. 12, 2006); 4 pages.
Asano et al., "AlGaInN laser diodes grown on an ELO-GaN substrate vs. on a sapphire substrate," Semiconductor Laser Conference (2000) Conference Digest, IEEE 17th International, 2000, pp. 109-110.
Asaoka, et al., "Observation of 1 f $^x$/noise of GaInP/GaAs triple barrier resonant tunneling diodes," AIP Conf. Proc., vol. 780, Issue 1 , 2005, pp. 492-495.
Ashby, et al., "Low-dislocation-density GaN from a single growth on a textured substrate," Applied Physics Letters, vol. 77, No. 20, Nov. 13, 2000, pp. 3233-3235.
Ashley, et al., "Heternogeneous InSb Quantum Well Transistors on Silicon for Ultra-High Speed, Low Power Logic Applications," 43 Electronics Letters 14, Jul. 2007, 2 pages.
Bai et al., "Study of the Defect Elimination Mechanisms in Aspect Ratio Trapping Ge Growth," Applied Physics Letters, vol. 90, 2007, 3 pages.
Bakkers et al., "Epitaxial Growth on InP Nanowires on Germanium," Nature Materials, vol. 3, Nov. 2004, pp. 769-773.
Baron et al., "Chemical Vapor Deposition of Ge Nanocrystals on $SiO_2$," Applied Physics Letters, vol. 83, No. 7, Aug. 18, 2003, pp. 1444-1446.
Bean et al., "$Ge_xSi_{1-x}$/Si strained-later Superlattice grown by molecular beam Epitaxy," Journal of Vacuum Science Technology A2 (2), Jun. 1984, pp. 436-440.
Beckett et al., "Towards a reconfigurable nanocomputer platform," ACM International Conference Proceeding Series, vol. 19, 2002 , pp. 141-150.
Beltz et al., "A Theoretical Model for Threading Dislocation Reduction During Selective Area Growth," Materials Science and Engineering, A234-236, 1997, pp. 794-797.
Belyaev, et al., "Resonance and current instabilities in AlN/GaN resonant tunneling diodes," 21 Physica E 2-4, 2004, pp. 752-755.
Berg, J., "Electrical Characterization of Silicon Nanogaps," Doktorsavhandlingar vid Chalmers Tekniska Hagskola, 2005, No. 2355, 2 pages.
Bergman et al., "RTD/CMOS Nanoelectronic Circuits: Thin-Film InP-based Resonant Tunneling Diodes Integrated with CMOS circuits," 20 Electron Device Letters 3, 1999, pp. 119-122.
Blakeslee, "The Use of Superlattices to Block the Propagation of Dislocations in Semiconductors," Mat. Res. Soc. Symposium Proceedings 148, 1989, pp. 217-227.
Bogumilowicz et al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.
Borland, "Novel Device structures by selective epitaxial growth (SEG)," Electron Devices Meeting, vol. 33, 1987, pp. 12-15.
Bryskiewicz, "Dislocation filtering in SiGe and InGaAs buffer layers grown by selective lateral overgrowth method," Applied Physics Letters, vol. 66, No. 10, Mar. 6, 1995, pp. 1237-1239.
Burenkov et al., "Corner Effect in Double and Triple Gate FinFETs"European solid-state device research, 33rd Conference on Essderc '03 Sep. 16-18, 2003, Piscataway, NJ, USA, IEEE, vol. 16, pp. 135-138, XPo10676716.
Bushroa et al., "Lateral epitaxial overgrowth and reduction in defect density of 3C—SiC on patterned Si substrates," Journal of Crystal Growth, vol. 271, No. 1-2, Oct. 15, 2004, pp. 200-206.
Calado, et al., "Modeling of a resonant tunneling diode optical modulator," University of Algarve, Department of Electronics and Electrical Engineering, 2005, pp. 96-99.
Campo et al., "Comparison of Etching Processes of Silicon and

(56) References Cited

OTHER PUBLICATIONS

Germanium in SF6—O2 Radio-Frequency Plasma," 13 Journal of Vac. Sci. Tech., B-2, 1995, pp. 235-241.
Cannon et al., "Monolithic Si-based Technology for Optical Receiver Circuits," Proceedings of SPIE, vol. 4999, 2003, pp. 145-155.
Chan et al., "Influence of Metalorganic Sources on the Composition Uniformity of Selectively Grown $Ga_xIn_{1-x}P$," Japan. Journal of Applied Physics, vol. 33, 1994, pp. 4812-4819.
Chang et al. "3-D simulation of strained Si/SiGe heterojunction FinFETs" Semiconductor Device Research Symposium, Dec. 10-12, 2003, pp. 176-177.
Chang et al., "Effect of growth temperature on epitaxial lateral overgrowth of GaAs on Si substrate," Journal of Crystal Growth, vol. 174, No. 1-4, Apr. 1997, pp. 630-634.
Chang et al., "Epitaxial Lateral Overgrowth of Wide Dislocation-Free GaAs on Si Substrates," Electrochemical Society Proceedings, vol. 97-21, May 13, 1998, pp. 196-200.
Chau et al., Opportunities and Challenges of III-V Nanoelectronics for Future High-Speed, Low Power Logic Applications, IEEE CSIC Digest, 2005, pp. 17-20.
Chen et al., "Dislocation reduction in GaN thin films via lateral overgrowth from trenches," Applied Physics Letters, vol. 75, No. 14, Oct. 4, 1999, pp. 2062-2063.
Chengrong, et al., "DBRTD with a high PVCR and a peak current density at room temperature," Chinese Journal of Semiconductors vol. 26, No. 10, Oct. 2005, pp. 1871-1874.
Choi et al., "Monolithic Integration GaAs/AlGaAs LED and Si Driver Circuit," 9 Electron Device Letters 10, Oct. 1988, 3 pages.
Choi et al., "Monolithic Integration of GaAs/AlGaAs Double-Heterostructure LEDs and Si MOSFETs," Electron Device Letters, vol. EDL-7, No. 9, Sep. 1986, 3 pages.
Choi et al., "Monolithic Integration of Si MOSFETs and GaAs MESFETs," Electron Device Letters, vol. EDL-7, No. 4, Apr. 1986, 3 pages.
Choi, et al., "Low-voltage low-power K-band balanced RTD-based MMIC VCO," 2006 IEEE, Department of EECS, Korea Advanced Institute of Science and Technology, 2006, pp. 743-746.
Cloutier et al., "Optical gain and stimulated emission in periodic nanopatterned crystalline silicon," Nature Materials, Nov. 2005, 5 pages.
Currie et al., "Carrier Mobilities and Process Stability of Strained Si n- and p-MOSFETs on SiGe Virtual Substrates," J. Vacuum Science Technology, B, vol. 19, No. 6, 2001, pp. 2268-2279.
Dadgar et al., "MOVPE growth of GaN on Si (111) substrates," Journal of Crystal Growth, vol. 248, Feb. 1, 2003, pp. 556-562.
Datta et al., "Silicon and III-V Nanoelectronics," IEEE International Conference on Indium Phosphide & Related Materials, 2005, pp. 7-8.
Datta et al., "Ultrahigh-Speed 0.5 V Supply Voltage In0.7Ga0.3As Quantum-Well Transistors on Silicon Substrate," 28 Electron Device Letters 8, 2007, pp. 685-687.
Davis et al., "Lateral epitaxial overgrowth of and defect reduction in GaN thin films," Lasers and Electro-Optics Society Annual Meeting (1998) LEOS '98. IEEE, vol. 1, Dec. 1-4, 1998, pp. 360-361.
De Boeck et al., "The fabrication on a novel composite $GaAs/SiO_2$ nucleation layer on silicon for heteroepitaxial overgrowth by molecular beam Epitaxy," Material Science and Engineering, B9, 1991, pp. 137-141.
Donaton et al., "Design and Fabrication of MOSFETs with a Reverse Embedded SiGe (Rev. e-SiGe) Structure," 2006 IEDM, pp. 465-468.
Dong, Y., et al, "Selective area growth of InP through narrow openings by MOCVD and its application to InP HBT," 2003 International Conference on Indium Phosphide and Related Materials, May 12-16, 2003, pp. 389-392.
European Patent Office, Extended European Search Report and Search Opinion dated Jan. 26, 2011 in EP Patent Application No. 10003084.0-2203 (9 pages).
European Search Report issued by the European Patent Office dated Dec. 15, 2010 in European Patent Application No. 10002884.4 (10 pages).
Examination Report in European Patent Application No. 06800414. 2, dated Mar. 5, 2009, 3 pages.
Extended European Search Report, Applicant: Taiwan Semiconductor Manufacturing Company, Ltd., Application No. 09815273.9-2203/2335273 PCT/US2009057493, dated Dec. 22, 2011, 15 pages.
Fang et al., "Electrically pumped hybrid AlGaInAs-silicon evanescent laser," 14 Optics Express 20, 2006, pp. 9203-9210.
Feltin et al., "Epitaxial lateral overgrowth of GaN on Si (111)," Journal of Applied Physics, vol. 93, No. 1, Jan. 1, 2003, pp. 182-185.
Feng et al., "Integration of Germanium-on Insulator and Silicon Substrate," 27 Electron Device Letters 11, 2006, pp. 911-913.
Fiorenza et al., "Film Thickness Constraints for Manufacturable Strained Silicon CMOS," 19 Semiconductor Science Technology, 2004, p. L4.
Fischer et al., "Elastic stress relaxation in SiGe epilayers on patterned Si substrates," 75 Journal of Applied Physics 1, 1994, pp. 657-659.
Fischer et al., "State of stress and critical thickness of Strained small-area SiGe layers,"Phys. Stat. Sol. (a) vol. 171, 1999, pp. 475-485.
Fitzgerald et al., "Elimination of Dislocations in Heteroepitaxial MBE and RTCVD $Ge_xSi_{1-x}$ Grown on Patterned Si Substrates," Journal of Electronic Materials, vol. 19, No. 9, 1990, pp. 949-955.
Fitzgerald et al., "Epitaxial Necking in GaAs Growth on Pre-patterned Si Substrates," Journal of Electronic Materials, vol. 20, No. 10, 1991, pp. 839-853.
Fitzgerald et al., "Nucleation Mechanisms and the Elimination of Misfit Dislocations at Mismatched Interfaces by Reduction in Growth Areas," Journal of Applied Physics, vol. 65, No. 6, Mar. 15, 1989, pp. 2220-2237.
Fitzgerald et al., "Structure and recombination in InGaAs/GaAs heterostructures," 63 Journal of Applied Physics, vol. 3, 1988, pp. 693-703.
Fitzgerald et al., "Totally relaxed $Ge_xSi_{1-x}$ layers with low threading dislocation densities grown on Si Substrates," vol. 59, Applied Physics Letters 7, 1991, pp. 811-813.
Fitzgerald, "The Effect of Substrate Growth Area on Misfit and Threading Dislocation Densities in Mismatched Heterostructures," Journal of Vacuum Science Technology, vol. 7, No. 4, Jul./Aug. 1989, pp. 782-788.
Gallagher et al., "Development of the magnetic tunnel junction MRAM at IBM: From first junctions to a 16-Mb MRAM demonstrator chip," 50 IBM J. Research & Dev. 1, Jan. 2006, pp. 5-23A.
Gallas et al., "Influence of Doping on Facet Formation at the $SiO_2$/Si Interface," Surface Sci. 440, 1999, pp. 41-48.
Geppert, "Quantum transistors: toward nanoelectronics," IEEE Spectrum, Sep. 2000, pp. 46-51.
Gibbon et al., "Selective-area low-pressure MOCVD of GaInAsP and related materials on planar InP substrates," Semicond. Sci. Tech. vol. 8, 1993, pp. 998-1010.
Glew et al., "New DFB grating structure using dopant-induced refractive index step," J. Crystal Growth 261, 2004, pp. 349-354.
Golka, et al., "Negative differential resistance in dislocation-free GaN/AlGan double-barrier diodes grown on bulk GaN," 88 Applied Physics Letters 17, Apr. 2006, pp. 172106-1-172106-3.
Goodnick, S.M., "Radiation Physics and Reliability Issues in III-V Compound Semiconductor Nanoscale Heterostructure Devices," Final Technical Report, Arizona State Univ. Dept. Electrical & Computer Eng, 80 pages, 1996-1999.
Gould et al., "Magnetic resonant tunneling diodes as voltage-controlled spin selectors," 241 Phys. Stat. Sol. (B), vol. 3, 2004, pp. 700-703.
Groenert et al., "Monolithic integration of room-temperature cw GaAs/AlGaAs lasers on Si substrates via relaxed graded GeSi buffer layers," 93 Journal of Applied Physics, No. 362, Jan. 2003, pp. 362-367.
Gruber, et al., "Semimagnetic Resonant Tunneling Diodes for Electron Spin Manipulation," Nanostructures: Physics & Technology, 8th International Symposium, 2000, pp. 483-486.

(56) References Cited

OTHER PUBLICATIONS

Gustafsson et al., "Cathodoluminescence from relaxed $Ge_xSi_{1-x}$ grown by heteroepitaxial lateral overgrowth," Journal of Crystal Growth 141, 1994, pp. 363-370.
Gustafsson et al., "Investigations of high quality $Ge_xSi_{1-x}$ grown by heteroepitaxial lateral overgrowth using cathodoluminescence," Inst. Phys. Conf. Ser., No. 134, Section 11, Apr. 1993, pp. 675-678.
Hammerschmidt, "Intel to Use Trigate Transistors from 2009 on," EETIMES Online, available at: http://www.eetimes.com/showArticle.jhtml?articleID=189400035 (Jun. 12, 2006). 1 page.
Hasegawa, et al., "Sensing Terahertz Signals with III-V Quantum Nanostructures," Quantum Sensing: Evolution and Revolution from Past to Future, SPIE 2003, pp. 96-105.
Hayafuji et al., Japan, Journal of Applied Physics, vol. 29, 1990, pp. 2371.
Hersee et al., "The Controlled Growth of GaN Nanowires," Nano Letters, vol. 6, No. 8, 2006, pp. 1808-1811.
Hiramatsu et al., "Fabrication and characterization of low defect density GaN using facet-controlled epitaxial lateral overgrowth (FACELO)," Journal of Crystal Growth, vol. 221, Dec. 2000, pp. 316-326.
Hollander et al., "Strain and Misfit Dislocation Density in Finite Lateral Size $Si_{1-x}Ge_x$/Si Films Grown by Selective Epitaxy," Thin Solid Films, vol. 292, 1997, pp. 213-217.
Hu et al., "Growth of Well-Aligned Carbon Nanotube arrays on Silicon Substrates Using Porous Alumina Film as a Nanotemplate," 79 Applied Physics Letters 19, 2001, 3 pages.
Yanlong, et al., "Monolithically fabricated OEICs using RTD and MSM," Chinese Journal Semiconductors vol. 27, No. 4, Apr. 2006, pp. 641-645.
Huang et al., "Electron and Hole Mobility Enhancement in Strained SOI by Wafer Bonding," 49 IEEE Transactions on Electron Devices 9, 2002, pp. 1566-1570.
Ying-Long, et al., "Resonant tunneling diodes and high electron mobility transistors integrated on GaAs substrates," Chinese Physics Letters 23, vol. 3, Mar. 2006, pp. 697-700.
Hydrick et al., "Chemical Mechanical Polishing of Epitaxial Germanium on $SiO_2$-patterned Si(001) Substrates," ECS Transactions, 16 (10), 2008, (pp. 237-248).
Intel Press Release, "Intel's Tri-Gate Transistor to Enable Next Era in Energy-Efficient Performance," Intel Corporation (Jun. 12, 2006). 2 pages.
Intel to Develop Tri-Gate Transistors Based Processors, available at: http://news.techwhack.com/3822/tri-gate-transistors/ (Jun. 13, 2006) 6 pages.
International Preliminary Report on Patentability for International Application No. PCT/US2006/019152 dated Nov. 29, 2007, 2 pages.
International Preliminary Report on Patentability for International Application No. PCT/US2006/029247 dated Feb. 7, 2008, 12 pages.
International Preliminary Report on Patentability for International Application No. PCT/US2006/033859 dated Mar. 20, 2008, 14 pages.
International Preliminary Report on Patentability for International Application No. PCT/US2007/019568 dated Mar. 19, 2009, 10 pages.
International Preliminary Report on Patentability for International Application No. PCT/US2007/020181 dated Apr. 2, 2009, 9 pages.
International Preliminary Report on Patentability for International Application No. PCT/US2007/020777 dated Apr. 9, 2009, 12 pages.
International Preliminary Report on Patentability for International Application No. PCT/US2007/021023 dated Apr. 9, 2009, 8 pages.
International Preliminary Report on Patentability for International Application No. PCT/US2007/022392 dated Apr. 30, 2009, 14 pages.
International Search Report and Written Opinion for International Application No. PCT/US2006/019152 dated Oct. 19, 2006, 11 pages.
International Search Report and Written Opinion for International Application No. PCT/US2006/029247 dated May 7, 2007, 19 pages.
International Search Report and Written Opinion for International Application No. PCT/US2008/068377, dated Jul. 6, 2009, 19 pages.
International Search Report and Written Opinion for International Application No. PCT/US2006/033859 dated Sep. 12, 2007, 22 pages.
International Search Report and Written Opinion for International Application No. PCT/US2007/007373, dated Oct. 5, 2007, 13 pages.
International Search Report and Written Opinion for International Application No. PCT/US2007/019568 dated Feb. 6, 2008, 13 pages.
International Search Report and Written Opinion for International Application No. PCT/US2007/020181 dated Jan. 25, 2008, 15 pages.
International Search Report and Written Opinion for International Application No. PCT/US2007/020777 dated Feb. 8, 2008, 18 pages.
International Search Report and Written Opinion for International Application No. PCT/US2007/021023 dated Jun. 6, 2008, 10 pages.
International Search Report and Written Opinion for International Application No. PCT/US2007/022392 dated Apr. 11, 2008, 20 pages.
International Search Report for International Application No. PCT/US2006/019152, dated May 17, 2005. 11 pages.
International Technology Roadmap for Semiconductors—Front End Processes, pp. 1-62 (2005).
Ipri et al., "MONO/POLY technology for fabricating low-capacitance CMOS integrated circuits," Electron Devices, IEEE Transactions, vol. 35, No. 8, Aug. 1988 pp. 1382-1383.
Ishibashi, et al., "3rd Topical Workshop on Heterostructure Microelectronics for Information Systems Applications," Aug.-Sep. 1998, 115 pages.
Ishitani et al., "Facet Formation in Selective Silicon Epitaxial Growth," 24 Japan, Journal of Applied Physics, vol. 10, 1985, pp. 1267-1269.
Ismail et al., "High-quality GaAs on Sawtooth-patterned Si Substrates," 59 Applied Physics Letters 19, 1991, pp. 2418-2420.
Jain et al., "Stresses in strained GeSi stripes and quantum structures: calculation using the finite element method and determination using micro-Raman and other measurements," Thin Solid Films 292, 1997, pp. 218-226.
Jeong, et al., "Performance improvement of InP-based differential HBT VCO using the resonant tunneling diode," 2006 International Conf. on Indium Phosphide and Related Mat. Conf. Proc., pp. 42-45.
Ju et al., "Epitaxial lateral overgrowth of gallium nitride on silicon substrate," Journal of Crystal Growth, vol. 263, No. 1-4, Mar. 1, 2004, pp. 30-34.
Kamins et al., "Kinetics of Selective Epitaxial Depostion of Si1—xGex," Hewlett-Packard Company, Palo Alto, CA, Appl. Phys. Lett. 61 (6), Aug. 10, 1992 (pp. 669-671).
Kamiyama, et al., "UV laser diode with 350.9-nm-lasing wavelength grown by hetero-epitaxial-lateral overgrowth technology," Selected Topics in Quantum Electronics, IEEE Journal of Selected Topics in Quantum Electronics, vol. 11, No. 5, Sep.-Oct. 2005, pp. 1069-1073.
Kamiyama, et al., "UV light-emitting diode fabricated on hetero-ELO-grown $Al_{0.22}Ga_{0.78}N$ with low dislocation density," Physica Status Solidi A, vol. 192, No. 2, Aug. 2002, pp. 296-300.
Kawai, et al., "Epitaxial Growth of InN Films and InN Nano-Columns by RF-MBE," The Institute of Electronics, Information and Communication Engineers, Gijutsu Kenkyu, vol. 13, No. 343 (CPM2003 102-116), 2003, pp. 33-37.
Kazi et al., "Realization of GaAs/AlGaAs Lasers on Si Substrates Using Epitaxial Lateral Overgrowth by Metalorganic Chemical Vapor Deposition," Japan, Journal of Applied Physics, vol. 40, 2001, pp. 4903-4906.
Kidoguchi et al., "Air-bridged lateral epitaxial overgrowth of GaN thin Films," Applied Physics Letters, vol. 76, No. 25, Jun. 19, 2000, pp. 3768-3770.
Kim et al., "Silicon-Based Field-Induced Band-to-Band Tunneling Effect Transistor," IEEE Electron Device Letters, No. 25, No. 6, 2004, pp. 439-441.

(56) References Cited

OTHER PUBLICATIONS

Kim et al., "GaN nano epitaxial lateral overgrowth on holographically patterned substrates," School of Physics and Inter-University Semiconductor Research Center, Seoul National University, Aug. 25-27, 2003, pp. 27-28.

Kimura et al., "Vibronic Fine Structure Found in the Blue Luminescence from Silicon Nanocolloids," Japan, Journal of Applied Physics, vol. 38, 1999, pp. 609-612.

Klapper, "Generation and Propagation of Dislocations During Crystal Growth," Mat. Chem. and Phys. vol. 66, 2000, pp. 101-109.

Knall et al., "Threading Dislocations in GaAs Grown with Free Sidewalls on Si mesas," Journal of Vac. Sci. Technol. B, vol. 12, No. 6, Nov./Dec. 1994, pp. 3069-3074.

Kollonitsch, et al., "Improved Structure and Performance of the GaAsSb/InP Interface in a Resonant Tunneling Diode," Journal of Crystal Growth, vol. 287, 2006, pp. 536-540.

Krishnamurthy, et al., "I—V characteristics in resonant tunneling devices: Difference Equation Method," Journal of Applied Physics, vol. 84, Issue 9, Condensed Matter: Electrical and Magnetic Properties (PACS 71-76), 1998, 9 pages.

Krost et al., "GaN-based Optoelectronics on Silicon Substrates," Materials Science & Engineering, B93, 2002, pp. 77-84.

Sudirgo et al., "Si-Based Resonant Interband Tunnel Diode/CMOS Integrated Memory Circuits," Rochester Institute of Technology, IEEE, 2006, pp. 109-112.

Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-L194.

Kushida et al., "Epitaxial growth of $PbTiO_3$ films on $SrTiO_3$ by RF magnetron sputtering," Ultrasonics, Ferroelectrics and Frequency Control, IEEE Transactions on Ultrasonics Ferroelectrics and Frequency Control, vol. 38, No. 6, Nov. 1991, pp. 656-662.

Kwok, "Barrier-Injection Transit Time Diode," Complete Guide to Semiconductor Devices, $2^{nd}$ ed., Chapter 18, 2002, pp. 137-144.

Lammers, "Trigate and High-k stack up vs. planar," EETIMES Online, available at: http://www.eetimes.com/showArticle.jhtml?articleID=188703323&pgno=2&printable=true (Jun. 12, 2006). 2 pages.

Langdo et al., "High Quality Ge on Si by Epitaxial Necking," Applied Physics Letters, vol. 76, No. 25, Jun. 19, 2000, pp. 3700-3702.

Langdo, "Selective SiGe Nanostructures," PhD Thesis, Massachusetts Institute of Technology, Jun. 2001, 215 pages.

Lee et al., "Growth of GaN on a nanoscale periodic faceted Si substrate by metal organic vapor phase epitaxy," Compound Semiconductors: Post-Conference Proceedings, Aug. 25-27, 2003, pp. 15-21.

Lee et al., "Strain-relieved, Dislocation-free $In_xGa_{1-x}As/GaAs(001)$ Heterostructure by Nanoscale-patterned Growth," Applied Physics Letters, vol. 85, No. 18, Nov. 1, 2004, pp. 4181-4183.

Li et al., "Defect Reduction of GasAs Epitaxy on Si (001) Using Selective Aspect Ratio Trapping," 91 Applied Physics Letters, 2007, pp. 021114-1-021114-3.

Li et al., "Heteroepitaxy of High-quality Ge on Si by Nanoscale Ge seeds Grown through a Thin Layer of $SiO_2$," Applied Physics Letters, vol. 85, No. 11, Sep. 13, 2004, pp. 1928-1930.

Li et al., "Monolithic Integration of GaAs/InGaAs Lasers on Virtual Ge Substrates via Aspect-Ratio Trapping," Journal of The Electrochemical Society, vol. 156, No. 7, 2009, pp. H574-H578.

Li et al., "Morphological Evolution and Strain Relaxation of Ge Islands Grown on Chemically Oxidized Si (100) by Molecular-Beam Epitaxy," Journal of Applied Physics, vol. 98, 2005, pp. 073504-1-073504-8.

Li et al., "Selective Growth of Ge on Si (100) through Vias of $Si_{o2}$ Nanotemplate Using Solid Source Molecular Beam Epitaxy," Applied Physics Letters, vol. 83, No. 24, Dec. 15, 2003, pp. 5032-5034.

Liang et al., "Critical Thickness enhancement of Epitaxial SiGe films Grown on Small Structures," Journal of Applied Physics, vol. 97, 2005, pp. 043519-1-043519-7.

Lim et al., "Facet Evolution in Selective Epitaxial Growth of Si by cold-wall ultrahigh vacuum chemical vapor deposition," Journal of Vac. Sci. Tech., vol. B 22, No. 2, 2004, pp. 682.

Liu et al., "High Quality Single-crystal Ge on Insulator by Liquid-phase Epitaxy on Si Substrates," Applied Physics Letters, vol. 84, No. 14, Apr. 4, 2004, pp. 2563-2565.

Liu et al., "Rapid Melt Growth of Germanium Crystals with Self Aligned Microcrucibles on Si Substrates," Journal of the Electrochemical Society, vol. 152, No. 8, 2005, pp. G688-G693.

Li, J. Z.,et al., "Defect reduction of GaAs/Si epitaxy by aspect ratio trapping", Journal of Applied Physics 103, 2008 American Institute of Physics, 3 pages.

Loo et al., "Successful Selective Epitaxial $Si_{1-x}Ge_x$ Deposition Process for HBT-BiCMOS and High Mobility Heterojunction pMOS Applications," 150 Journal of Electrochemical Society 10, 2003, pp. G638-G647.

Lourdudoss et al., "Semi-insulating epitaxial layers for optoelectronic devices," Semiconducting and Insulating Materials Conference, SIMC-XI, 2000, pp. 171-178.

Luan et al., "High-quality Ge Epilayers on Si with Low Threading-dislocation Densities," Applied Physics Letters, vol. 75, No. 19, Nov. 8, 1999, pp. 2909-2911.

Luan, "Ge Photodetectors for Si Microphotonics," PhD Thesis, Massachusetts Institute of Technology, Department of Materials Science & Engineering, Jan. 12, 2001, 155 pages.

Lubnow et al., "Effect of III/V-Compound Epitaxy on Si Metal-Oxide-Semiconductor Circuits," Japan, Journal of Applied Physics, vol. 33, 1994, pp. 3628-3634.

Luo et al., Enhancement of (IN,Ga)N Light-Emitting Diode Performance by Laser Liftoff and Transfer From Sapphire to Silicon, IEEE Photonics Technology Letters, vol. 14, No. 10, 2002, pp. 1400-1402.

Luryi et al., "New Approach to the High Quality Epitaxial Growth of Latticed-Mismatched Materials," Applied Physics Letters, vol. 49, No. 3, Jul. 21, 1986, pp. 140-142.

Ma, et al., "A small signal equivalent circuit model for resonant tunneling diode," Chinese Physics Letters, vol. 23, No. 8, Aug. 2006, pp. 2292-2295.

Ma, et al., "Fabrication of an AlAs/In0.53/Ga0.47/As/InAs resonant tunneling diode on InP substrate for high-speed circuit applications," 27 Chinese J. Semiconductors 6, Jun. 2006, pp. 959-962.

Maekawa, et al., "High PVCR Si/Si1-x/Gex DW RTD formed with a new triple-layer buffer," Materials Science in Semiconductor Processing, vol. 8, 2005, pp. 417-421.

Maezawa, et al., "Metamorphic resonant tunneling diodes and its application to chaos generator ICs,"44 Jap. J. Applied Physics, Part 1, No. 7A, Jul. 2005, pp. 4790-4794.

Maezawa, et al., "InP-based resonant tunneling diode/HEMT integrated circuits for ultrahigh-speed operation," IEEE Nagoya University, Institute for Advanced Research, 2006, pp. 252-257.

Martinez et al., "Characterization of GaAs Conformal Layers Grown by Hydride Vapour Phase Epitaxy on Si Substrates by Microphotoluminescence Cathodoluminescence and MicroRaman," Journal of Crystal Growth, vol. 210, 2000, pp. 198-202.

Matsunaga et al., "A New Way to Achieve Dislocation-Free Heteroepitaxial Growth by Molecular Beam Epitaxy: Vertical Microchannel Epitaxy," Journal of Crystal Growth, vol. 237-239, 2002, pp. 1460-1465.

Matthews et al., "Defects in Epitaxial Multilayers—Misfit Dislocations," Journal of Crystal Growth, vol. 27, 1974, pp. 118-125.

Monroy, et al., "High UV/visible Contrast Photodiodes Based on Epitaxial Lateral Overgrown GaN layers," Electronics Letters, vol. 35, No. 17, Aug. 19, 1999, pp. 1488-1489.

Nakano et al., "Epitaxial Lateral Overgrowth of AlN Layers on Patterned Sapphire Substrates," Source: Physica Status Solidi A, vol. 203, No. 7, May 2006, pp. 1632-1635.

Nam et al., "Lateral Epitaxy of Low Defect Density GaN Layers via Organometallic Vapor Phase Epitaxy," Applied Physics Letters, vol. 71, No. 18, Nov. 3, 1997, pp. 2638-2640.

(56) References Cited

OTHER PUBLICATIONS

Naoi et al., "Epitaxial Lateral Overgrowth of GaN on Selected-area Si (111) Substrate with Nitrided Si Mask," Journal of Crystal Growth, vol. 248, 2003, pp. 573-577.
Naritsuka et al., "InP Layer Grown on (001) Silicon Substrate by Epitaxial Lateral Overgrowth," Japan, Journal of Applied Physics, vol. 34, 1995, pp. L1432-L1435.
Naritsuka et al., "Vertical Cavity Surface Emitting Laser Fabricated on GaAs Laterally Grown on Si Substrate," Electrochemical Society Proceedings, vol. 97, No. 21, pp. 86-90.
Neudeck, et al., "Novel silicon Epitaxy for advanced MOSFET devices," Electron Devices Meeting, IEDM Technical Digest International, 2000, pp. 169-172.
Neumann et al., "Growth of III-V Resonant Tunneling Diode on Si Substrate with LP-MOVPE," Journal of Crystal Growth, vol. 248, 2003, pp. 380-383.
Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.
Noborisaka, J., et al., "Fabrication and characterization of freestanding GaAs/AlGaAs core-shell nanowires and AlGaAs nanotubes by suing selective-area metalorganic vapor phase epitaxy," Applied Physics Letters, vol. 87, Aug. 24, 2005, pp. 093109-1-093109-3.
Noda, et al., "Current-voltage characteristics in double-barrier resonant tunneling diodes with embedded GaAs quantum rings," Physica E 32, 2006, pp. 550-553.
Norman, et al., "Characterization of MOCVD Lateral Epitaxial Overgrown III-V Semiconductor Layers on GaAs Substrates," Compound Semiconductors, Aug. 25-27, 2003, pp. 45-46.
Notification of Transmittal of the International Search Report and the Written Opinion of the International Searching Authority for PCT/US2010/029552, Applicant: Taiwan Semiconductor Manufacturing Company, Ltd., dated May 26, 2010, 14 pages.
Oehrlein et al., "Studies of the Reactive Ion Etching of SiGe Alloys," J. Vac. Sci. Tech, A9, No. 3, May/Jun. 1991, pp. 768-774.
Orihashi, et al., "Experimental and theoretical characteristics of sub-terahertz and terahertz oscillations of resonant tunneling diodes integrated with slot antennas," 44 Jap. J. Applied Physics, Part 1, No. 11, Nov. 2005, pp. 7809-7815.
Parillaud et al., "High Quality InP on Si by Conformal Growth," Applied Physics Letters, vol. 68, No. 19, May 6, 1996, pp. 2654-2656.
Park et al., "Defect Reduction and its Mechanism of Selective Ge Epitaxy in Trenches on Si(001) Substrates Using Aspect Ratio Trapping," Mat. Res. Society Symp. Proc., vol. 994, 2007, 6 pages.
Park et al., "Defect Reduction of Selective Ge Epitaxy in Trenches on Si (001) Substrates Using Aspect Ratio Trapping," Applied Physics Letters 90, 052113, Feb. 2, 2007, 3 pages.
Park et al., "Fabrication of Low-Defectivity, Compressively Strained Geon $Si_{0.2}Ge_{0.8}$ Structures Using Aspect Ratio Trapping," Journal of The Electrochemical Society, vol. 156, No. 4, 2009, pp. H249-H254.
Park et al., "Growth of Ge Thick Layers on Si (001) Substrates Using Reduced Pressure Chemical Vapor Deposition," 45 Japan, Journal of Applied Physics, vol. 11, 2006, pp. 8581-8585.
Partial International Search for International Application No. PCT/US2006/033859 dated Jun. 22, 2007, 7 pages.
Partial International Search Report for International Application No. PCT/US2008/004564 completed Jul. 22, 2009, dated Oct. 16, 2009, 5 pages.
Partial International Search Report for International Application No. PCT/US2008/068377, completed Mar. 19, 2008, dated Apr. 22, 2008, 3 pages.
PCT International Search Report of PCT/US2009/057493, from PCT/ISA/210, dated Mar. 22, 2010, Applicant: Amberwave System Corporation et al., 2 pages.
Pidin et al., "MOSFET Current Drive Optimization Using Silicon Nitride Capping Layer for 65-nm Technology Node," Symposium on VLSI Technology, Dig. Tech. Papers, 2004, pp. 54-55.

Piffault et al., "Assessment of the Strain of InP Films on Si Obtained by HVPE Conformal Growth," Indium Phosphide and Related Materials, Conference Proceedings, Sixth International Conference on Mar. 27-31, 1994, pp. 155-158.
Pribat et al., "High Quality GaAs on Si by Conformal Growth," Applied Physics Letters, vol. 60, No. 17, Apr. 27, 1992, pp. 2144-2146.
Prost, ed. "QUDOS Technical Report," 2002-2004, 77 pages.
Prost, et al., "High-speed InP-based resonant tunneling diode on silicon substrate," Proceedings of the 31st European Solid-State Device Research Conf., 2005, pp. 257-260.
Radulovic, et al., "Transient Quantum Drift-Diffusion Modelling of Resonant Tunneling Heterostructure Nanodevices," Physics of Semiconductors: $27^{th}$ International Conference on the Physics of Semiconductors—ICPS-27, Jun. 2005 AIP Conf. Proc., pp. 1485-1486.
Reed et al., "Realization of a Three-Terminal Resonant Tunneling Device: The Bipolar Quantum Resonant Tunneling Transistor," 54 Applied Physics Letters 11, 1989, p. 1034.
Ren et al., "Low-dislocation-density, Nonplanar GaN Templates for Buried Heterostructure Lasers Grown by Lateral Epitaxial Overgrowth," Applied Physics Letters, vol. 86, No. 11, Mar. 14, 2005, pp. 111901-1-111901-3.
Rim et al., "Enhanced Hole Mobilities in Surface-Channel Strained-Si p-MOSFETs," 1995 IEDM, pp. 517-520.
Rim et al., "Fabrication and Mobility Characteristics of Ultra-thin Strained Si Directly on Insulator (SSDOI) MOSFETs," IEDM Tech. Dig., 2003, pp. 49-52.
Ringel et al., "Single-junction InGaP/GaAs Solar Cells Grown on Si Substrates with SiGe Buffer Layers," Prog. Photovolt., Res. & Applied, vol. 10, 2002, pp. 417-426.
Rosenblad et al., "A Plasma Process for Ultrafast Deposition of SiGe Graded Buffer Layers," 76 Applied Physics Letters 4, 2000, pp. 427-429.
Sakai, "Defect Structure in Selectively Grown GaN Films with Low Threading Dislocation Density," Applied Physics Letters 71, vol. 16, 1997, pp. 2259-2261.
Sakai, "Transmission Electron Microscopy of Defects in GaN Films Formed by Epitaxial Lateral Overgrowth," 73 Applied Physics Letters 4, 1998, pp. 481-483.
Sakawa et al., "Effect of Si Doping on Epitaxial Lateral Overgrowth of GaAs on GaAs-Coated Si Substrate," Japan, Journal of Applied Physics, vol. 31, 1992, pp. L359-L361.
Pae, et al., "Multiple Layers of Silicon-on-Insulator Islands Fabrication by Selective Epitaxial Growth," Electron Device Letters, IEEE, vol. 20, No. 5, May 1999, pp. 194-196.
Sass, et al., "Strain in GaP/GaAs and GaAs/GaP resonant tunneling heterostructures," Journal of Crystal Growth, vol. 248, Feb. 2003, pp. 375-379.
Schaub, et al., "Resonant-Cavity-Enhanced High-Speed Si photodiode Grown by Epitaxial Lateral Overgrowth," Photonics Technology Letters, IEEE, vol. 11, No. 12, Dec. 1999, pp. 1647-1649.
Seabaugh et al., Promise of Tunnel Diode Integrated Circuits, Tunnel Diode and CMOS/HBT Integration Workshop, Naval Research Laboratory, Dec. 9, 1999, 13 pages.
Shahidi, et al., "Fabrication of CMOS on Ultrathin SOI Obtained by Epitaxial Lateral Overgrowth and Chemical-Mechanical Polishing," Electron Devices Meeting, Technical Digest, International, Dec. 9-12, 1990, pp. 587-590.
Shichijo et al., "Co-Integration of GaAs MESFET & Si CMOS Circuits," 9 Elec. Device Letters 9, Sep. 1988, pp. 444-446.
Shubert, E.F., "Resonant tunneling diode (RTD) structures," Rensselear Polytechnic Institute, 2003, pp. 1-14.
Siekkinen, et al., "Selective Epitaxial Growth Silicon Bipolar Transistors for Material Characterization," Electron Devices, IEEE Transactions on Electron Devices, vol. 35, No. 10, Oct. 1988, pp. 1640-1644.
Su et al., "Catalytic Growth of Group III-nitride Nanowires and Nanostructures by Metalorganic Chemical Vapor Deposition," Applied Physics Letters, vol. 86, 2005, pp. 013105-1-013105-3.

(56) References Cited

OTHER PUBLICATIONS

Su et al., "New Planar Self-Aligned Double-Gate Fully-depleted P-MOSFETs Using Epitaxial Lateral Overgrowth (ELO) and selectively grown source/drain (S/D)," 2000 IEEE Int'l SOI Conf., pp. 110-111.

Suhara, et al, "Characterization of argon fast atom beam source and its application to the fabrication of resonant tunneling diodes," 2005 International Microprocesses and Nanotechnology Conf. Di. of Papers, 2005, pp. 132-133.

Sun et al., Electron resonant tunneling through InAs/GaAs quantum dots embedded in a Schottky diode with an AlAs insertion layer, 153 J. Electrochemical Society 153, 2006, pp. G703-G706.

Sun et al., "Room-temperature observation of electron resonant tunneling through InAs/AlAs quantum dots," 9 Electrochemical and Solid-State Letters 5, May 2006, pp. G167-G170.

Sun et al., "InGaAsP Multi-Quantum Wells at 1.5 /splmu/m Wavelength Grown on Indium Phosphide Templates on Silicon," Indium Phosphide and Related Materials, May 12-16, 2003, pp. 277-280.

Sun et al., "Selective Area Growth of InP on InP Precoated Silicon Substrate by Hydride Vapor Phase epitaxy," Indium Phosphide and Related Materials Conference, IPRM. 14$^{th}$, 2002, pp. 339-342.

Sun et al., "Sulfur Doped Indium Phosphide on Silicon Substrate Grown by Epitaxial Lateral Overgrowth," Indium Phosphide and Related Materials 16$^{th}$ IPRM, May 31-Jun. 4, 2004, pp. 334-337.

Sun et al., "Temporally Resolved Growth of InP in the Opening Off-Oriented from [110] Direction," Idium Phosphide and Related Materials, Conference Proceedings, 2000 International Conference, pp. 227-230.

Sun et al., "Thermal Strain in Indium Phosphide on Silicon Obtained by Epitaxial Lateral Overgrowth," 94 Journal of Applied Physics 4, 2003, pp. 2746-2748.

Suryanarayanan et al., "Microstructure of Lateral Epitaxial Overgrown InAs on (100) GaAs Substrates," Applied Physics Letters, vol. 83, No. 10, Sep. 8, 2003, pp. 1977-1979.

Suzuki, et al., "Mutual injection locking between sub-THz oscillating resonant tunneling diodes," Japan Science and Technology Agency, IEEE, Joint 30$^{th}$ International Conference on Infrared and Millimeter Waves & 13$^{th}$ International Conference on Terahertz Electronics, 2005, pp. 150-151.

Takasuka et al., "AlGaAs/InGaAs DFB Laser by One-Time Selective MOCVD Growth on a Grating Substrate," 43 Japan, Journal of Applied Physics, 4B, 2004, pp. 2019-2022.

Takasuka et al., "InGaAs/AlGaAs Quantum Wire DFB Buried HeteroStructure Laser Diode by One-Time Selective MOCVD on Ridge Substrate," 44 Japan, Journal of Applied Physics, 4B, 2005, pp. 2546-2548.

Tamura et al., "Heteroepitaxy on High-Quality GaAs on Si for Optical Interconnections on Si Chip," Proceedings of the SPIE, vol. 2400, 1995, pp. 128-139.

Tamura et al., "Threading Dislocations in GaAs on Pre-patterned Si and in Post-patterned GaAs on Si," Journal of Crystal Growth, vol. 147, 1995, pp. 264-273.

Tanaka et al., "Structural Characterization of GaN Lateral Overgrown on a (111) Si Substrate," Applied Physics Letters, vol. 79, No. 7, Aug. 13, 2001, pp. 955-957.

Thean et al., "Uniaxial-Biaxial Hybridization for Super-Critical Strained-Si Directly on Insulator (SC-SSOI) PMOS with Different Channel Orientations," IEEE, 2005, pp. 1-4.

Thelander, et al., "Heterostructures incorporated in one-dimensional semiconductor materials and devices," Physics of Semiconductors, vol. 171, 2002, 1 page. Abstract Only.

Thompson et al., "A Logic Nanotechnology Featuring Strained-Silicon," 25 IEEE Electron Device Letters 4, 2004, pp. 191-193.

Tomiya et al., "Dislocation Related Issues in the Degradation of GaN-Based Laser Diodes," Selected Topics in Quantum Electronics, IEEE Journal of Selected Topics in Quantum Electronics, vol. 10, No. 6, Nov./Dec. 2004, pp. 1277-1286.

Tomiya, "Dependency of crystallographic tilt and defect distribution of mask material in epitaxial lateral overgrown GaN layers," Applied Physics Letters vol. 77, No. 5, pp. 636-638.

Tran et al., "Growth and Characterization of InP on Silicon by MOCVD," Journal of Crystal Growth, vol. 121, 1992, pp. 365-372.

Tsai, et al., "InP/InGaAs resonant tunneling diode with six-route negative differential resistances," 13th European Gallium Arsenide and other Compound Semiconductors Application Symp., 2006, pp. 421-423.

Tsang et al., "The heteroepitaxial Ridge-Overgrown Distributed Feedback Laser," Quantum Electronics, IEEE Journal of Quantum Electronics, vol. 21, No. 6, Jun. 1985, pp. 519-526.

Tsaur, et al., "Low-Dislocation-Density GaAs epilayers Grown on Ge-Coated Si substrates by Means of Lateral Epitaxial Overgrowth," Applied Physics Letters, vol. 41, No. 15, Aug. 1982, pp. 347-349.

Tseng et al., "Effects of Isolation Materials on Facet Formation for Silicon Selective Epitaxial Growth," 71 Applied Physics Letters 16, 1997, pp. 2328.

Tsuji et al., Selective Epitaxial Growth of GaAs on Si with Strained Sort-period Superlattices by Molecular Beam Epitaxy under Atomic Hydrogen Irradiation, J. Vac. Sci. Technol. B, vol. 22, No. 3, May/Jun. 2004, pp. 1428-1431.

Ujiie, et al., Epitaxial Lateral Overgrowth of GaAs on a Si Substrate, 28, Japan, Journal of Applied Physics, vol. 3, Mar. 1989, pp. L337-L339.

Usuda et al., "Strain Relaxation of Strained-Si Layers on SiGe-on-Insulator (SGOI) Structures After Mesa Isolation," Applied Surface Science, vol. 224, 2004, pp. 113-116.

Usui et al., "Thick GaN Epitaxial Growth with Low Dislocation Density by Hydride Vapor Phase Epitaxy," vol. 36, Japan, Journal of Applied Physics, 1997, pp. L899-L902.

Vanamu et al., "Epitaxial Growth of High-Quality Ge Films on Nanostructured Silicon Substrates," Applied Physics Letters, vol. 88, 2006, pp. 204104.1-204.104.3.

Vanamu et al., "Growth of High Quality Ge/Si$_{1-x}$Ge$_x$ on Nano-scale Patterned Si Structures," J. Vac. Sci. Technology. B, vol. 23, No. 4, Jul./Aug. 2005, pp. 1622-1629.

Vanamu et al., "Heteroepitaxial Growth on Microscale Patterned Silicon Structures," Journal of Crystal Growth, vol. 280, 2005, pp. 66-74.

Vanamu et al., "Improving Ge Si$_x$Ge$_{1-x}$ Film Quality through Growth onto Patterned Silicon Substrates," Advances in Electronics Manufacturing Technology, Nov. 8, 2004, pp. 1-4.

Vescan et al., "Lateral Confinement by Low Pressure Chemical Vapor Deposition-Based Selective Epitaxial Growth of Si$_{1-x}$Ge$_x$/Si Nanostructures," No. 81, Journal of Applied Physics 10, 1997, pp. 6709-6715.

Vetury et al., "First Demonstration of AlGaN/GaN Heterostructure Field Effect Transistor on GaN Grown by Lateral Epitaxial Overgrowth (ELO)," Inst. Phys. Conf. Ser. No. 162: Ch. 5, Oct. 1998, pp. 177-183.

Walker, et al., "Magnetotunneling spectroscopy of ring-shaped (InGa)As quantum dots: Evidence of excited states with 2pz character," 32 Physica E 1-2, May 2006, pp. 57-60.

Wang et al, "Fabrication of Patterned Sapphire Substrate by Wet Chemical Etching for Maskless Lateral Overgrowth of GaN," Journal of Electrochemical Society, vol. 153, No. 3, Mar. 2006, pp. C182-C185.

Ting, et al., "Modeling Spin-Dependent Transport in InAS/GaSb/AlSb Resonant Tunneling Structures," 1 J. Computational Electronics, 2002, pp. 147-151.

Watanabe, et al., "Fluoride resonant tunneling diodes on Si substrates," IEEE International Semiconductor Device Research Symp. Dec. 2005, pp. 177-178.

Wernersson et al., "InAs Epitaxial Lateral Growth of W Marks," Journal of Crystal Growth, vol. 280, 2005, pp. 81-86.

Williams et al., "Etch Rates for Micromachining Processing—Part II," Journal of Microelectromechanical Systems, vol. 4, 1996, pp. 761-778.

Williams et al., "Etch Rates for Micromachining Processing—Part II," Journal of Microelectromechanical Systems, vol. 5, No. 4, Dec. 1996, pp. 256-269.

(56) References Cited

OTHER PUBLICATIONS

Wu et al., "Enhancement-mode InP n-channel metal-oxide-semiconductor field-effect-transistors with atomic-layer-deposited Al2O3 dielectrics," Applied Physics Letters 91, 022108-022110 (2007).

Wu et al., Gross-Sectional Scanning/Tunneling Microscopy Investigations of Cleaned III-V Heterostructures, Technical report, Dec. 1996, 7 pages.

Wu et al., "Inversion-type enhancement-mode InP MOSFETs with ALD Al2O3, HfAlO nanolaminates as high-k gate dielectrics," Proceedings of the 65th Device Research Conf., 2007, pp. 49-52.

Wuu et al., "Defect Reduction and Efficiency Improvement of Near-Ultraviolet Emitters via Laterally Overgrown GaN on a GaN/Patterned Sapphire Template," Applied Physics Letters, vol. 89, No. 16, Oct. 16, 2006, pp. 161105-1-161105-3.

Xie et al., "From Porous Si to Patterned Si Substrate: Can Misfit Strain Energy in a Continuous Heteropitaxial Film Be Reduced?" Journal of Vacuum Science Technology, B, vol. 8, No. 2, Mar./Apr. 1990, pp. 227-231.

Xu et al., "Spin-Filter Devices Based on Resonant Tunneling Antisymmetrical Magnetic Semiconductor Hybrid Structures," vol. 84, Applied Physics Letters 11, 2004, pp. 1955-1957.

Yamaguchi et al., "Analysis for Dislocation Density Reduction in Selective Area Growth GaAs Films on Si Substrates," Applied Physics Letters, vol. 56, No. 1, Jan. 1, 1990, pp. 27-29.

Yamaguchi et al., "Defect Reduction Effects in GaAs on Si Substrates by Thermal Annealing," Applied Physics Letters vol. 53, No. 23, 1998, pp. 2293.

Yamaguchi et al., GaAs Solar Cells Grown on Si Substrates for Space Use: Prog. Photovolt.: Res. Appl., vol. 9, 2001; pp. 191-201.

Yamaguchi et al., "Super-High-Efficiency Multi-junction Solar Cells," Prog. Photovolt.: Res. Appl., vol. 13, 2005, pp. 125-132.

Yamamoto et al., "Optimization of InP/Si Heteroepitaxial Growth Conditions Using Organometallic Vapor Phase Epitaxy," Journal of Crystal Growth, vol. 96, 1989, pp. 369-377.

Yang et al., "High Performance CMOS Fabricated on Hybrid Substrate with Different Crystal Orientations," IEDM Tech. Dig., 2003, pp. 453-456.

Yang et al., "Selective Area Deposited Blue GaN—InGaN Multiple-quantum Well Light Emitting Diodes over Silicon Substrates," Applied Physics Letter, vol. 76, No. 3, Jan. 17, 2000, pp. 273-275.

Yili, et al., "Physics-based hydrodynamic simulation of direct current characteristics in DBRTD," 29 Chinese J. Electron Devices 2, Jun. 2006, pp. 365-368.

Yin et al., "Ultrathin Strained-SOI by Stress Balance on Compliant Substrates and FET Performance," 52 IEEE Trans. on Electron Devices 10, 2005, pp. 2207-2214.

Dong et al., "Selective area growth of InP through narrow openings by MOCVD and its application to inP HBT," Indium Phosphide and Related Materials, International Conference, May 12-16, 2003, pp. 389-392.

Yoon et al., "Selective Growth of Ge Islands on Nanometer-scale Patterned SiO$_2$/Si Substrate by Molecular Beam Epitaxy," Applied Physics Letters, vol. 89, 2006, pp. 063107.1-063107.3.

Yoshizawa et al., "Growth of self-Organized GaN Nanostructures on Al 2O3 (0001) by RF-Radial Source Molecular Beam Epitaxy", Japan, Journal of Applied Physics, Part 2, vol. 36, No. 4B, 1997, pp. L459-L462.

Zamir et al., Thermal Microcrack Distribution Control in GaN Layers on Si Substrates by Lateral Confined Epitaxy, Applied Physics Letters, vol. 78, No. 3, Jan. 15, 2001, pp. 288-290.

Zang et al., "Nanoheteroepitaxial lateral overgrowth of GaN on nanoporous Si (111)," Applied Physics Letters, vol. 88, No. 14, Apr. 3, 2006, pp. 141925.

Zang et al., "Nanoscale lateral epitaxial overgrowth of GaN on Si (111)," Applied Physics Letters, vol. 87, No. 19 (Nov. 7, 2005) pp. 193106.1-193106.3.

Zela et al., "Single-crystalline Ge Grown Epitaxially on Oxidized and Reduced Ge/Si (100) Islands," Journal of Crystal Growth, vol. 263, 2004, pp. 90-93.

Zhang et al., "Removal of Threading Dislocations from Patterned Heteroepitaxial Semiconductors by Glide to Sidewalls," Journal of Electronic Materials, vol. 27, No. 11, 1998, pp. 1248-1253.

Zhang et al., "Strain Status of Self-Assembled InAs Quantum Dots," Applied Physics Letters, vol. 77, No. 9, Aug. 28, 2000, pp. 1295-1297.

Zheleva et al., "Lateral Epitaxy and Dislocation Density Reduction in Selectively Grown GaN Structures," Journal of Crystal Growth, vol. 222, No. 4, Feb. 4, 2001, pp. 706-718.

Zubia et al., "Initial Nanoheteroepitaxial Growth of GaAs on Si (100) by OMVPE," Journal of Electronic Materials, vol. 30, No. 7, 2001, pp. 812-816.

\* cited by examiner

Trapped dislocations

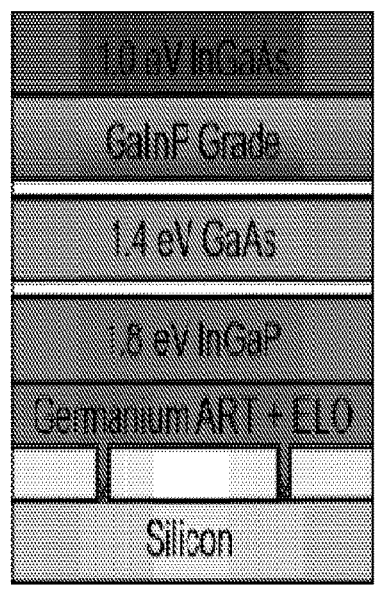
1) Inverted Growth on Ge ART + ELO
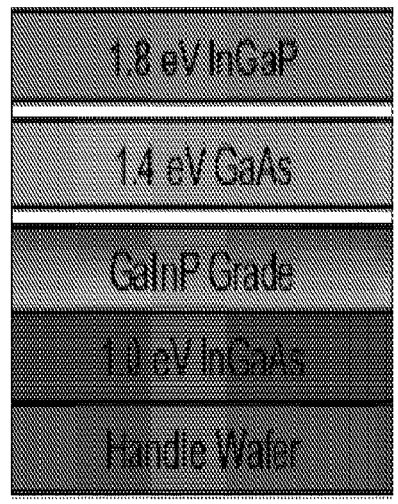
2) Flip, Bond, Selectively Remove Substrate

FORMATION OF DEVICES BY EPITAXIAL LAYER OVERGROWTH

The present application a divisional of U.S. patent application Ser. No. 13/243,521, filed Sep. 23, 2011, entitled "Formation of Devices by Epitaxial Layer Overgrowth," which is a continuation of U.S. patent application Ser. No. 12/680,872, filed Mar. 30, 2010, entitled "Formation of Devices by Epitaxial Layer Overgrowth," which is the National Stage of International Application No. PCT/US09/57493, filed Sep. 18, 2009, entitled "Formation of Devices by Epitaxial Layer Overgrowth," which application claims priority from the following United States provisional patent applications: U.S. Provisional Patent Application Ser. No. 61/098,597, filed Sep. 19, 2008, entitled "Formation of Devices by Epitaxial Layer Overgrowth"; U.S. Provisional Patent Application Ser. No. 61/099,074, filed Sep. 22, 2008, entitled "Light Emitting Devices Formed with Aspect Ration Trapping and Epitaxial Lateral Overgrowth"; and U.S. Provisional Patent Application Ser. No. 61/104,466, filed Oct. 10, 2008, entitled "Hybrid Applications Using Aspect-Ration Trapping, Epitaxial-Layer Overgrowth, and Wafer Bonding." All of the above applications are incorporated by reference herein and for which benefit of the priority dates are hereby claimed.

TECHNICAL FIELD

The present invention relates to fabrication or structures including a semiconductor crystalline material. For example, improved epitaxial growth or structures may occur over a planarized surface including a semiconductor crystalline material.

BACKGROUND

This section provides background information and introduces information related to various aspects of the disclosure that are described and/or claimed below. These background statements are not admissions of prior art.

Techniques involving substrate patterning exploit the fact that the threading dislocations are constrained by geometry, i.e. that a dislocation cannot end in a crystal. If the free edge is brought closer to another free edge by patterning the substrate into smaller growth areas, then it is possible to reduce threading dislocation densities. In the past, a combination of substrate patterning and epitaxial lateral overgrowth ("ELO") techniques was demonstrated to greatly reduce defect densities in gallium nitride device, leading to fabrication of laser diodes with extended lifetimes. This process substantially eliminates defects in ELO regions but highly defective seed windows remain, necessitating repetition of the lithography and epitaxial steps to eliminate all defects. In a similar approach, pendeo-epitaxy eliminates substantially all defects in the epitaxial region proximate to the substrate but requires one lithography and two epitaxial growth steps. Furthermore, both techniques require the increased lateral growth rate of gallium nitride, which has not been demonstrated in all heteroepitaxial systems.

Another known technique termed "epitaxial necking" was demonstrated in connection with fabricating a Ge-on-Si heterostructure by Langdo et al. in "High Quality Ge on Si by Epitaxial Necking," Applied Physics Letters, Vol. 76, No. 25, April 2000. This approach offers process simplicity by utilizing a combination of selective epitaxial growth and defect crystallography to force defects to the sidewall of the opening in the patterning mask, without relying on increased lateral growth rates. Specifically, in the (111)<110> diamond cubic slip system, misfit dislocations lie along <110> directions in the (100) growth plane while the threading segments rise up on (111) planes in <110> directions. Threading segments in <110> directions on the (111) plane propagate at a 45° angle to the underlying Si (100) substrate surface. Thus, if the aspect ratio of the holes in the patterning mask is greater than 1, threading segments will be blocked by the mask sidewall, resulting in low-defect top Ge "nodules" formed directly on Si. One important limitation of epitaxial necking, however, is the size of the area to which it applies. In general, as discussed in more detail below, the lateral dimensions in both dimensions have to be relatively small in order for the dislocations to terminate at sidewalls.

Thus, there is a need in the art for versatile and efficient methods of fabricating semiconductor heterostructures that would constrain dislocation defects in a variety of lattice-mismatched materials systems. There is also a need in the art for semiconductor devices utilizing a combination of integrated lattice-mismatched materials with reduced levels of dislocation defects for improved functionality and performance.

BRIEF SUMMARY

Methods and structures are provided for formation of devices, e.g., solar cells, on substrates including, e.g., lattice-mismatched materials, by the use of aspect ratio trapping (ART) and epitaxial layer overgrowth (ELO).

In general, in a first aspect, embodiments of the invention may include a method of forming a structure. The method includes forming a first opening in a masking layer disposed over a substrate that includes a first semiconductor material. A first layer, which includes a second semiconductor material lattice-mismatched to the first semiconductor material, is formed within the first opening. The first layer has a thickness sufficient to extend above a top surface of the masking layer. A second layer, which includes the second semiconductor material, is formed on the first layer and over at least a portion of the masking layer. A vertical growth rate of the first layer is greater than a lateral growth rate of the first layer and a lateral growth rate of the second layer is greater than a vertical growth rate of the second layer.

One or more of the following features may be included. A second opening may be formed in the masking layer prior to forming the first layer, and the first layer may be formed within the second opening prior to forming the second layer. A third layer, which includes the second semiconductor material, is formed on the second layer. The third layer coalesces between the first opening and the second opening.

Dislocation defects in the first layer may be trapped within the first opening. The vertical growth rate of the first layer may be increased by doping the first layer during formation thereof. The lateral growth rate of the first layer may be reduced by doping the first layer during formation thereof. The lateral growth rate of the first layer may be reduced by adjusting the growth parameters to create facets on a top surface of the first layer during formation thereof. Reducing the vertical growth rate of the second layer may include doping the second layer during formation thereof.

Reducing the vertical growth rate of the second layer may include doping the second layer during formation thereof to form a first type of facet in the second layer and to suppress formation of a second type of facet in the second layer. Increasing the lateral growth rate of the second layer may include doping the second layer during formation thereof.

The coalescence of the third layer may be facilitated by doping the third layer during formation thereof. Coalescence of the third layer between the first opening and the second opening may be facilitated by doping the third layer during formation thereof.

Doping the third layer may slow facet growth in the third layer and reduces stacking fault formation in the third layer. The second semiconductor material may include germanium. The second semiconductor material may include p-type dopants. Forming at least one of the first, second, or third layers may include epitaxial growth. Forming the first layer may include using germanium tetrachloride as a precursor. The method may further include, after forming the third layer, removing a top portion of the third layer to remove defects. The method may further include forming a photonic device on the third layer after the top portion is removed. A top portion of the first layer may define a facet non-parallel to a top surface of the substrate. The third layer may be self-planarizing. The third layer may be self-planarized by growing the third layer primarily in a (100) direction.

The method may further include forming a fourth layer on top of the third layer, the fourth layer including a third semiconductor material. A fifth layer may be formed on top of the fourth layer, the fifth layer including a fourth semiconductor material. A handle wafer may be bonded to the fifth layer and the substrate may be removed. The third semiconductor material and the fourth semiconductor material each may include III-V materials. The substrate may include silicon. The handle wafer may include a metal. A bandgap of the third semiconductor material may be greater than a bandgap of the fourth semiconductor material. The structure may include a multi junction photovoltaic cell.

In general, in another aspect, embodiments of the invention may include a method of forming a structure. The method includes forming an opening having a width $w_1$ in a masking layer disposed over a substrate, the substrate including a first semiconductor material. A first layer, which includes a second semiconductor material lattice-mismatched to the first semiconductor material, may be formed within the opening. The first layer extends vertically above a top surface of the masking layer and laterally to a width $w_2$ greater than $w_1$. A portion of the first layer is removed, and a remainder of the first layer has a thickness $t_1$ over a first area of the substrate proximate the opening. A second layer, which includes the second semiconductor material, is formed on the first layer and extends laterally to a width $w_3$ greater than $w_2$. A portion of the second layer is removed, and a remainder of the second layer has a thickness $t_2$ over a second area of the substrate proximate the opening.

One or more of the following features may be included. In various embodiments, $t_1$ equals $t_2$. Removing the portion of the first layer may include at least one of etching or chemical-mechanical polishing. The steps of forming the first layer and removing the portion of the first layer may be performed in different machines. The steps of forming the first layer and removing the portion of the first layer may be performed in the same machine. Dislocation defects in the second semiconductor material may be trapped in the opening. A portion of the first layer above the surface of the substrate may be substantially free of dislocation defects. A vertical growth rate of the second semiconductor material may be greater than a lateral growth rate of the second semiconductor material.

A sidewall of the opening may include a dielectric material. Epitaxial growth may be used to form at least one of the first layer and second layer. The method may further include forming the first layer using germanium tetrachloride as a precursor, after forming the second layer, removing a top portion of the second layer, and/or forming a photonic device on the second layer. A top portion of the first layer may define a facet non-parallel to a top surface of the substrate. The second layer may be self-planarizing. The second layer may be self-planarized by growing the second layer primarily in a (100) direction.

The method may further include forming a third layer on top of the second layer, the third layer including a third semiconductor material. A fourth layer, which may include a fourth semiconductor material, may be formed on top of the third layer. The fourth layer may be bonded to a handle wafer and the substrate may be removed. The third semiconductor material and the fourth semiconductor material may include III-V materials, the substrate may include silicon, and the handle wafer may include a metal. A bandgap of the third semiconductor material may be greater than a bandgap of the fourth semiconductor material. The structure may include a multi junction photovoltaic cell.

In general, in yet another aspect, embodiments of the invention may include a method of forming a layer. The method includes forming a first opening in a masking layer disposed over a substrate. A first layer, which includes a cubic semiconductor material, is formed in the first opening. The first layer has a thickness sufficient to extend vertically above a top surface of the substrate. A second layer, which also includes the cubic semiconductor material, is formed on the first layer. A vertical growth rate of the first layer is greater than a lateral growth rate of the first layer and a lateral growth rate of the second layer is greater than a vertical growth rate of the second layer.

Embodiments of the method may further include, prior to forming the first layer, forming a second opening in masking layer. Prior to forming the second layer, a first layer may be formed within the second opening. The second layer may be coalesced between the first opening and the second opening. The masking layer may include semiconductor a dielectric material. The first opening in the substrate may include a (110) surface and the substrate may include silicon. The method may further include trapping dislocation defects in the first layer in the first opening. Decreasing the vertical growth rate of the second layer and increasing the lateral growth of the second layer may include changing growth conditions. The growth conditions may include 0.1 atmospheres and 750° C.

The cubic semiconductor material may include germanium, GaAs, InP, or other III-V materials. The cubic semiconductor material may be doped. Defects in the first layer are trapped in the first opening. A device may be formed in the second layer. The device may be a photonic device. A top portion of the second layer may be etched. A top portion of the first layer may define a facet non-parallel to a top surface of the substrate. The second layer may be self-planarizing. The second layer may be self-planarized by growing the second layer primarily in a (100) direction.

The method may further include forming a third layer on top of the second layer, the third layer including a third semiconductor material. A fourth layer, which may include a fourth semiconductor material, may be formed on top of the third layer. The fourth layer may be bonded to a handle wafer and the substrate may be removed. The third semiconductor material and the fourth semiconductor material may include III-V materials, the substrate may include silicon, and the handle wafer may include a metal. A bandgap of the third semiconductor material may be greater than a bandgap of the fourth semiconductor material. The structure may include a multi junction photovoltaic cell.

BRIEF DESCRIPTION OF THE DRAWINGS

These and/or other aspects and utilities of the present general inventive concept will become apparent and more readily appreciated from the following description of the embodiments, taken in conjunction with the accompanying drawings, of which:

FIGS. 5a and 5b are diagrams that illustrate a cross-sectional schematic of inverse solar cell grown on a Ge ART and ELO substrate.

DETAILED DESCRIPTION

Fundamental ART processes, including lift-off technologies, are described in detail in U.S. patent application Ser. No. 12/147,027 filed on Jun. 26, 2008 entitled "Multi-Junction Solar Cell". The formation of solar cells using ART techniques is described in U.S. patent application Ser. No. 12/180,254 filed on Jul. 25, 2008 entitled "Lattice-mismatched semiconductor structures with reduced dislocation defect densities and related methods for device fabrication".

Figure 1:
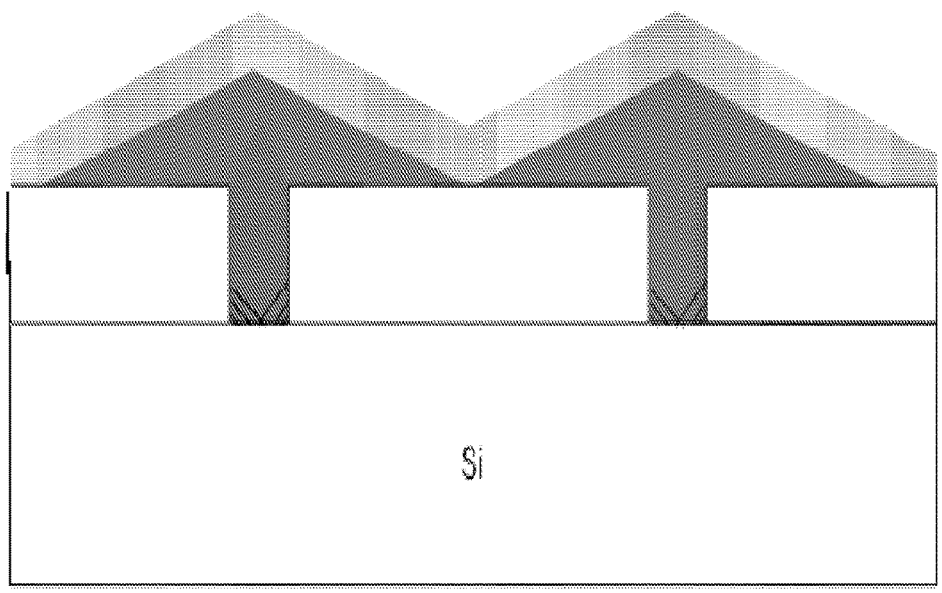
FIG. 1 is a diagram that illustrates a cross-sectional schematic of utilizing ELO, controlled by the use of impurities in trenches using ART.

Embodiments of the invention utilizing ELO, controlled by the use of impurities, are set forth in FIG. 1. ELO may be performed on wafers by employing the control of faceting. Faceting may be controlled, for example, by varying impurity levels in a material, varying the growth temperature, varying the growth pressure, varying the precursor gas flow rates, and/or varying the precursor chemical composition. The control of faceting may be desirable for at least two purposes: (i) to increase ELO lateral growth for a given vertical growth, and (ii) to reduce stacking faults or dislocations during coalescence. In an embodiment, faceting of germanium on Si (100) wafers formed in (110) trenches may be controlled using known faceting behavior. The same technique may be applied to other materials and orientations as well. The illustrative embodiment shows the application of faceting control to a combination of ART and ELO, but the technique may also be applied to only ELO.

Figure 2:
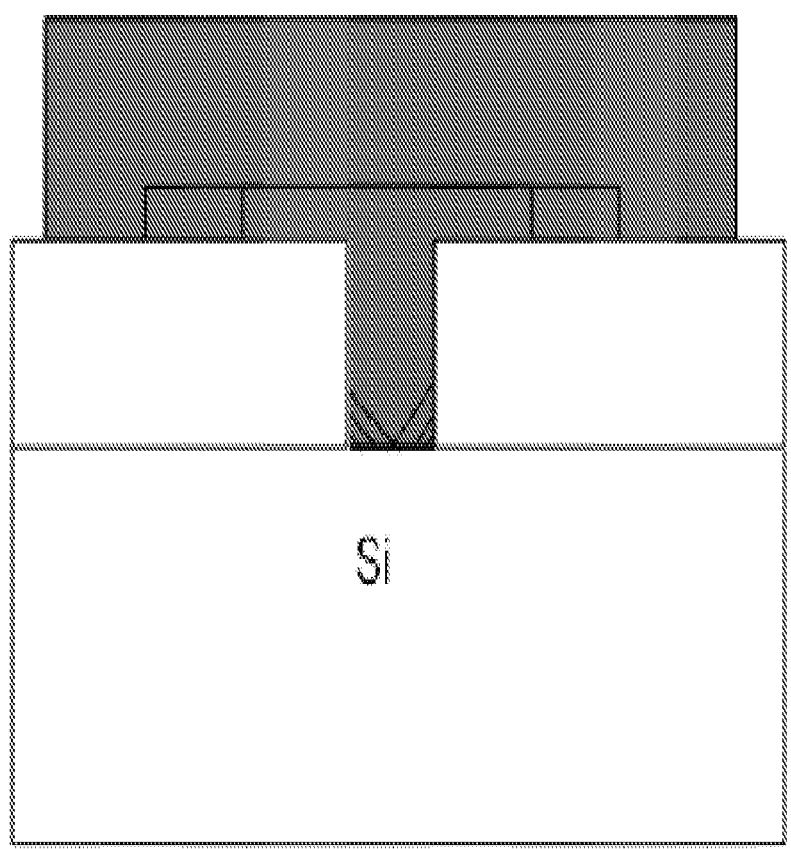
FIG. 2 is a diagram that illustrates a cross-sectional schematic of utilizing ELO with repeated removal and regrowth of layers in trenches using ART.

Other embodiments of the invention utilize ELO with repeated removal and regrowth of layers, as set forth in FIG. 2. ELO is a technique used to grow mismatched epitaxy. A maximum lateral overgrowth length may be limited by a maximum allowable thickness of the film. A lateral overgrowth length may be increased by repeatedly thinning the film and re-growing. The thinning and re-growth steps may be performed in different machines, or could happen in the same machine. This technique may be used with ART or with traditional ELO.

Figure 3:
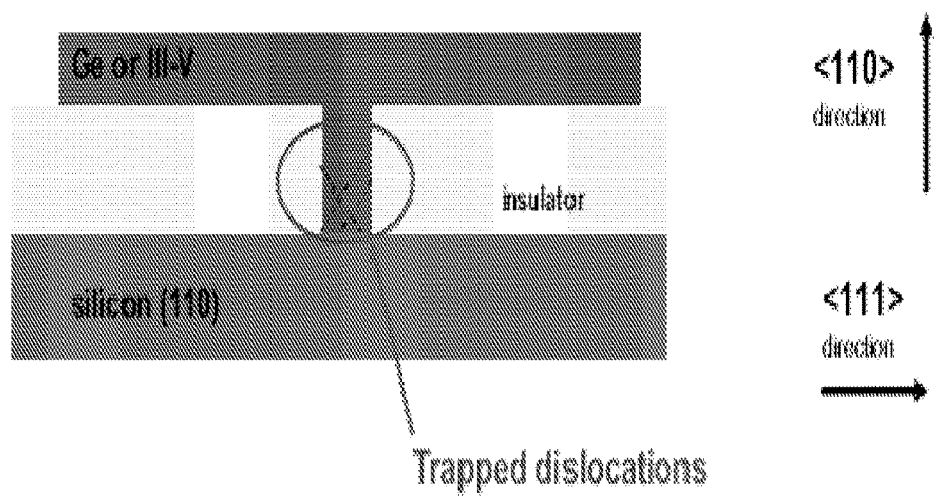
FIG. 3 is a diagram that illustrates a cross-sectional schematic of utilizing ELO of cubic semiconducting materials in trenches using ART.

Still other embodiments of the invention provide methods for effective ELO of cubic semiconducting materials, as set forth in FIG. 3. GaN and other III-N semiconductors have a hexagonal crystal structure. Conditions that favor a high ratio of horizontal to vertical growth rates ($GR_{horizontal}/GR_{vertical}$) have not been shown for cubic semiconducting materials such as Ge, or III-V's such as GaAs or InP. This fact makes use of ELO much more difficult. A possible solution is to selectively control vertical and horizontal growth rates. In an exemplary process, one may start with a (110)-surface substrate, e.g. silicon (110). An insulator is deposited and patterned thereover. A Ge or III-V cubic material is grown, e.g. under growth conditions conducive to both vertical and horizontal growth. Then, parameters are switched to growth conditions that allow almost no growth in <110> direction, but significant growth in a direction perpendicular to <110>, such as <111> directions. See Noborisaka et al., Applied Physics Letters 86 213102 (2005), and Noborisaka et al., Applied Physics Letters 87 093109 (2005). The key here is using a (110) substrate. This, in effect, allows one to move from a high $GR_{vertical}/GR_{horizontal}$ to a high $GR_{horizontal}/GR_{vertical}$, which is preferred for ELO.

Figure 4:
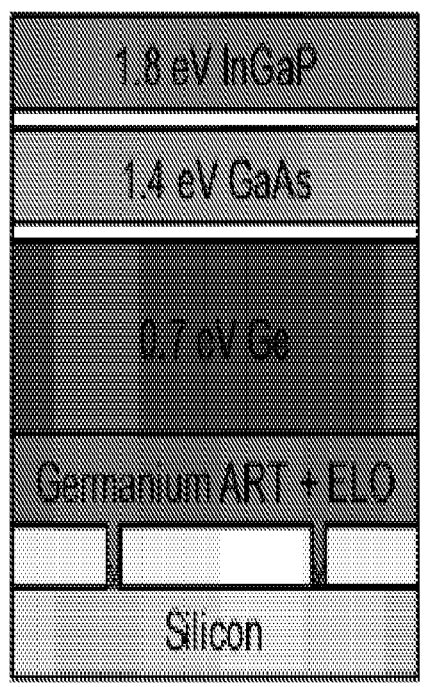
FIG. 4 is a diagram that illustrates a cross-sectional schematic of utilizing formation of solar cells by the use of ART and ELO.

Embodiments of the invention including the formation of solar cells by the use of ART and ELO are set forth in FIG. 4. The FIG. 4 shows Ge ART+ELO being used to replace a germanium substrate in a conventional multi junction configuration. In the conventional configuration, a GaAs p/n junction and an InGaP p/n junction are grown on a germanium wafer. The InGaP junction has a high band-gap (1.8 eV) and collects the highest energy light, the GaAs junction (1.4 eV) has a medium-level band-gap and collects the medium energy light. In the conventional configuration, the lowest energy light is collected by a germanium p/n junction that is formed on top of the Germanium wafer.

The conventional configuration may not work well if Ge ART+ELO is used to replace the germanium wafer. There are two reasons for this. First, the germanium cell used in the conventional configuration may be too thick. The coefficient of thermal expansion (CTE) of germanium is much different from the coefficient of thermal expansion (CTE) of silicon. Germanium grown is typically not stressed at the growth temperature, but is stressed after the cool down. Cracks may form in the germanium to relieve the stress if the germanium is grown too thick. The thickness that may lead to cracks is approximately between 5-10 microns; the exact thickness depends on the growth temperature. The germanium cell used in the conventional multi junction configuration is preferably at least 20 microns thick. This thickness is preferred because germanium is not a very good absorber of light because the band-gap of germanium is indirect. If the germanium cell is made too thin, much of the light may pass through the germanium cell without being absorbed, which is likely to reduce the efficiency of the cell. This thickness is also required because of current matching: if the germanium cell is too thin, the current that may be produced in the bottom cell may be lower than that which may be produced in the top cell, thereby reducing the current in a series connected device and thus its efficiency.

The second reason that the conventional configuration may not work well with Ge ART+ELO is because of the high resistance between the germanium and the silicon substrate in this configuration. The current can only pass between the germanium and silicon via the narrow trenches that connect the two. The oxide that forms the trenches blocks current conduction in the other paths. This high resistance may reduce the efficiency of a solar cell.

The FIGS. 5a and 5b describes a possible approach for addressing these problems. An inverse solar cell may be grown on a Ge ART+ELO substrate as shown in FIG. 5a.

First, the high band-gap InGaP is grown, then GaAs, and then InGaAs. An GaInP buffer layer may be used between the GaAs and InGaAs to accommodate the difference in the lattice constant between InGaAs and GaAs. The InGaAs solar cell may be made quite thin, typically 2 micrometers, because InGaAs is a direct band-gap semiconductor, and therefore absorbs light efficiently. After the cells are grown, the wafer may be flipped over and bonded to a conductive handle wafer. The Ge ART+ELO substrate may then be removed by selective etching. The selective etching is preferably done very accurately because the silicon substrate, that will be removed, is far thicker than the compound semiconductor solar cell, that is not removed. This selective etching may be accomplished by using a very selective wet etch, such as KOH, which etches silicon quickly but etches germanium very slowly. The thin oxide and germanium ART+ELO layers may then be removed in another step, and this step is not nearly as challenging because these layers are not thick relative the compound semiconductor solar cell.

Inspection of the FIG. 5b shows the two problems described above have been well addressed in the inverted cell approach. The InGaAs solar cell that absorbs the low energy light is thin enough to be grown on the Ge ART+ELO substrate without causing cracking. The handle wafer provides a low resistance path for the solar cell current.

What is claimed is:

1. A semiconductor structure comprising:
a conductive handle wafer, no junction of a photovoltaic cell being within the conductive handle wafer;
a first semiconductor layer comprising InGaAs over and directly bonded to the conductive handle wafer, the first semiconductor layer comprising a first p-n junction and having a first band gap;
a buffer layer comprising GaInP over and physically contacting the first semiconductor layer;
a second semiconductor layer comprising GaAs over and physically contacting the buffer layer, the second semiconductor layer comprising a second p-n junction and having a second band gap, the second band gap being greater than the first band gap;
a third semiconductor layer comprising InGaP over and physically contacting the second semiconductor layer, the third semiconductor layer comprising a third p-n junction and having a third band gap, the third band gap being greater than the second band gap; and
a carrier substrate connected to the third semiconductor layer, the carrier substrate operable to be removed from the third semiconductor layer, the carrier substrate comprising:
a first crystalline material comprising silicon;
an insulating layer having a thickness over and physically contacting the first crystalline material, the insulating layer having a trench extending to the first crystalline material, the trench having a height and a width, wherein the height exceeds the width; and
a second crystalline material comprising germanium disposed in the trench and physically contacting a top surface of the insulating layer, the second crystalline material being lattice mismatched to the first crystalline material, wherein substantially all defects arising from the lattice mismatch terminate in the trench, wherein the third semiconductor layer is in physical contact with the second crystalline material and is located over the defects located in the trench.

2. The semiconductor structure of claim 1, wherein the first semiconductor layer is approximately 2 micrometers.

3. The semiconductor structure of claim 1, wherein the conductive handle wafer comprises a metal.

4. The semiconductor structure of claim 1, wherein the buffer layer has a graded composition.

5. The semiconductor structure of claim 1, wherein wherein the second crystalline material adjoins a (110)-surface of the first crystalline material.

6. The semiconductor structure of claim 1, wherein the second crystalline material includes p-type dopants.

7. The semiconductor structure of claim 1, wherein a bandgap energy of the first semiconductor layer is about to eV, a bandgap energy of the second semiconductor layer is about 1.4 eV, and a bandgap energy of the third semiconductor layer is about 1.8 eV.

8. A semiconductor structure comprising:
a conductive handle wafer, no junction of a photovoltaic cell being within the conductive handle wafer;
a multi-junction photovoltaic cell on a first side of the conductive handle wafer, the multi junction photovoltaic cell comprising:
a first semiconductor material over and directly bonded to the conductive handle wafer, the first semiconductor material comprising InGaAs;
a graded buffer material over and physically contacting the first semiconductor material, the graded buffer material comprising GaInP;
a second semiconductor material over and physically contacting the graded buffer material, a bandgap energy of the second semiconductor material being greater than a bandgap energy of the first semiconductor material, the second semiconductor material comprising GaAs; and
a third semiconductor material over and physically contacting the second semiconductor material, a bandgap energy of the third semiconductor material being greater than the bandgap energy of the second semiconductor material, the third semiconductor material comprising InGaP; and
a carrier substrate connected to the third semiconductor layer, the carrier substrate operable to be removed from the third semiconductor layer, the carrier substrate comprising:
a first crystalline material comprising silicon;
an insulating layer having a thickness over the first crystalline material, the insulating layer having a trench extending to the first crystalline material, the trench having a height and a width, wherein the height exceeds the width; and
a second crystalline material comprising germanium disposed in the trench and on a top surface of the insulating layer, the second crystalline material being lattice mismatched to the first crystalline material, substantially all defects arising from the lattice mismatch terminating in the trench, wherein the third semiconductor layer is in physical contact with the second crystalline material and is located over the defects located in the trench.

9. The semiconductor structure of claim 8, wherein no material comprising germanium is disposed between the conductive handle wafer and the first semiconductor material.

10. The semiconductor structure of claim 8, wherein each of the first semiconductor material, the second semiconductor material, and the third semiconductor material comprises a III-V semiconductor compound.

11. The semiconductor structure of claim 8, wherein the bandgap energy of the first semiconductor material is to eV, the bandgap energy of the second semiconductor material is 1.4 eV, and the bandgap energy of the third semiconductor material is 1.8 eV.

12. The semiconductor structure of claim 8, wherein the second crystalline material is doped with p-type dopants.

13. The semiconductor structure of claim 8, wherein the first semiconductor material is approximately 2 micrometers.

14. A semiconductor structure comprising:
   a removable structure comprising:
      a first substrate comprising a first crystalline material, the first crystalline material comprising silicon;
      an insulating layer over and physically contacting the first substrate, the insulating layer having a trench formed therein, the trench extending to the first substrate, the trench having a height and a width, wherein the height exceeds the width; and
      a second crystalline material comprising a first portion disposed in the trench and physically contacting the first substrate and further comprising a second portion over and physically contacting a top surface of the insulating layer, the second portion of the second crystalline material forming a layer having a thickness from the top surface of the insulating layer and in a direction perpendicular to the top surface of the insulating layer, the second crystalline material being lattice mismatched to the first crystalline material, the second crystalline material comprising germanium, wherein substantially all defects in the second crystalline material arising from the lattice mismatch are limited to being in the first portion of the second crystalline material, wherein the first substrate, the insulating layer, and the second crystalline material are operable to be removed;
   a first semiconductor material disposed over the defects in the first portion of the second crystalline material and physically contacting the second portion of the second crystalline material, the first semiconductor material comprising InGaP;
   a second semiconductor material disposed over and physically contacting the first semiconductor material, a bandgap energy of the first semiconductor material being greater than a bandgap energy of the second semiconductor material, the second semiconductor material comprising GaAs;
   a buffer layer disposed over and physically contacting the second semiconductor material, the buffer layer comprising GaInP;
   a third semiconductor material disposed over and physically contacting the buffer layer, the bandgap energy of the second semiconductor material being greater than a bandgap energy of the third semiconductor material, the third semiconductor material comprising InGaAs; and
   a second substrate directly bonded to the third semiconductor material, wherein the second substrate is conductive and comprises metal.

15. The semiconductor structure of claim 14, wherein the second crystalline material is a cubic crystalline material.

16. The semiconductor structure of claim 14, wherein the second crystalline material adjoins a (110)-surface of the first crystalline material.

17. The semiconductor structure of claim 14, wherein the second crystalline material further comprises a III-V compound.

18. The semiconductor structure of claim 14, wherein the second crystalline material adjoins a (110)-surface of the first crystalline material.

19. The semiconductor structure of claim 14, wherein the second crystalline material comprises p-type dopants.

20. The semiconductor structure of claim 14, wherein the third semiconductor material has a thickness of about 2 micrometers.

* * * * *

UNITED STATES PATENT AND TRADEMARK OFFICE
CERTIFICATE OF CORRECTION

PATENT NO. : 9,934,967 B2
APPLICATION NO. : 13/737731
DATED : April 3, 2018
INVENTOR(S) : Hydrick et al.

Page 1 of 1

It is certified that error appears in the above-identified patent and that said Letters Patent is hereby corrected as shown below:

In the Claims

In Column 8, Lines 5-6, Claim 5, delete "wherein wherein" and insert --wherein--.

In Column 8, Lines 11-12, Claim 7, delete "is about to eV" and insert --is about 1.0 eV--.

In Column 8, Line 67, Claim 11, delete "is to eV" and insert --is 1.0 eV--.

Signed and Sealed this
Fourteenth Day of August, 2018

Andrei Iancu
*Director of the United States Patent and Trademark Office*